(12) United States Patent
Mokhlesi et al.

(10) Patent No.: US 7,797,480 B2
(45) Date of Patent: Sep. 14, 2010

(54) METHOD FOR READING NON-VOLATILE STORAGE USING PRE-CONDITIONING WAVEFORMS AND MODIFIED RELIABILITY METRICS

(75) Inventors: Nima Mokhlesi, Los Gatos, CA (US); Dengtao Zhao, Palo Alto, CA (US); Henry Chin, Palo Alto, CA (US)

(73) Assignee: Sandisk Corporation, Milpitas, CA (US)

( * ) Notice: Subject to any disclaimer, the term of this patent is extended or adjusted under 35 U.S.C. 154(b) by 663 days.

(21) Appl. No.: 11/693,663

(22) Filed: Mar. 29, 2007

(65) Prior Publication Data

US 2008/0244162 A1    Oct. 2, 2008

(51) Int. Cl.
*G06F 12/00* (2006.01)

(52) U.S. Cl. .................. 711/103; 711/154; 711/167; 711/E12.001; 365/185.01; 365/185.03; 365/185.14

(58) Field of Classification Search .................. None
See application file for complete search history.

(56) References Cited

U.S. PATENT DOCUMENTS

| | | | |
|---|---|---|---|
| 5,386,422 A | 1/1995 | Endoh | |
| 5,522,580 A | 6/1996 | Varner, Jr. | |
| 5,570,315 A | 10/1996 | Tanaka | |
| 5,719,808 A | 2/1998 | Harari | |
| 5,774,397 A | 6/1998 | Endoh | |
| 6,046,935 A | 4/2000 | Takeuchi | |
| 6,222,762 B1 * | 4/2001 | Guterman et al. | 365/185.03 |
| 6,456,528 B1 | 9/2002 | Chen | |
| 6,498,749 B1 | 12/2002 | Cuppens | |
| 6,522,580 B2 | 2/2003 | Chen | |
| 6,621,739 B2 | 9/2003 | Gonzalez | |
| 6,850,441 B2 | 2/2005 | Mokhlesi | |
| 6,859,397 B2 | 2/2005 | Lutze | |
| 7,012,835 B2 | 3/2006 | Gonzalez | |
| 7,020,829 B2 | 3/2006 | Eroz | |

(Continued)

OTHER PUBLICATIONS

F. Sun, K. Rose, and T. Zhang, On the Use of Strong BCH Codes for Improving Multilevel NAND Flash Memory Storage Capacity, IEEE Workshop on Signal Processing Systems (SiPS): Design and Implementation, Oct. 2006.

(Continued)

*Primary Examiner*—Reginald G Bragdon
*Assistant Examiner*—Shawn X Gu
(74) *Attorney, Agent, or Firm*—Vierra Magen Marcus & DeNiro LLP

(57) ABSTRACT

Data stored in non-volatile storage is read using sense operations and associated pre-conditioning waveforms. The pre-conditioning waveform provides a short term history for a non-volatile element which is analogous to the conditions experienced during programming when a programming pulse is applied prior to a verify operation. The pre-conditioning waveform can cause electrons to enter and exit trap sites, for instance, so that the accuracy of a probabilistic decoding process is improved. In one approach, multiple read operations are performed, some with pre-conditioning waveforms and some without. Pre-conditioning waveforms with different characteristics, such as amplitude, shape, duration and time before the associated read pulse, can also be used. For probabilistic decoding, initial reliability metrics can be developed based on multiple reads. Tables which store the reliability metrics can then be prepared for use in subsequent decoding.

37 Claims, 28 Drawing Sheets

U.S. PATENT DOCUMENTS

| | | |
|---|---|---|
| 7,046,568 B2 | 5/2006 | Cernea |
| 7,196,928 B2 | 3/2007 | Chen |
| 2004/0015771 A1 | 1/2004 | Lasser |
| 2004/0057287 A1 | 3/2004 | Cernea |
| 2004/0083334 A1 | 4/2004 | Chang |
| 2004/0109357 A1 | 6/2004 | Cernea |
| 2004/0255090 A1 | 12/2004 | Guterman |
| 2005/0024939 A1 | 2/2005 | Chen |
| 2006/0123318 A1 | 6/2006 | Kim |
| 2006/0126390 A1 | 6/2006 | Gorobets |
| 2006/0140007 A1 | 6/2006 | Cernea |
| 2006/0158947 A1 | 7/2006 | Chan |
| 2006/0178755 A1 | 8/2006 | Ling |
| 2006/0190799 A1 | 8/2006 | Kan |

OTHER PUBLICATIONS

D. MacKay, Information Theory, Inference and Learning Algorithms, Cambridge University Press, Sep. 25, 2003, chapter 47.

* cited by examiner

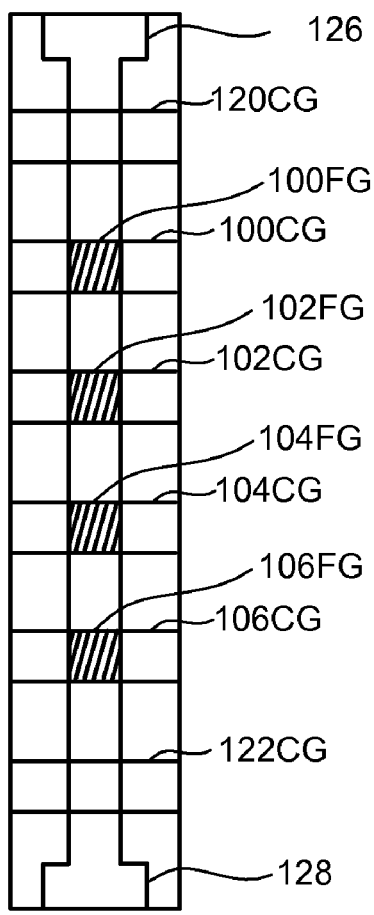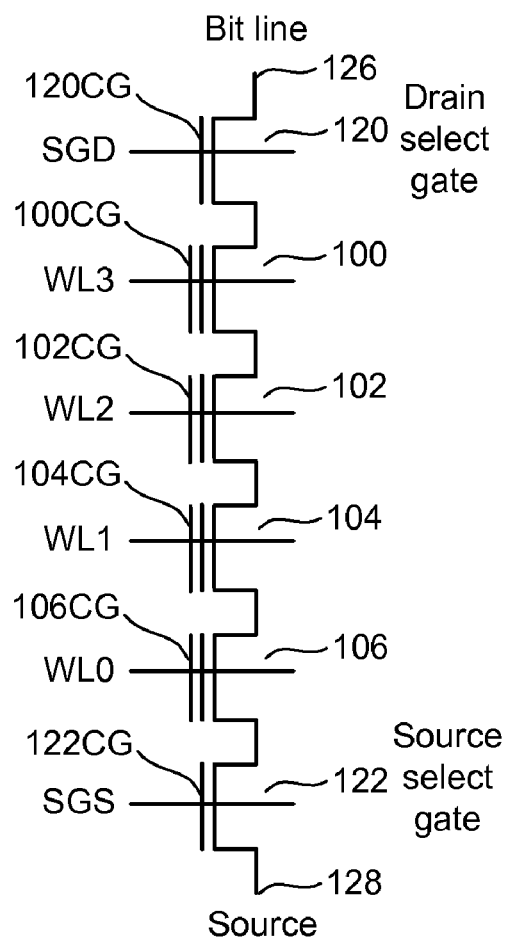

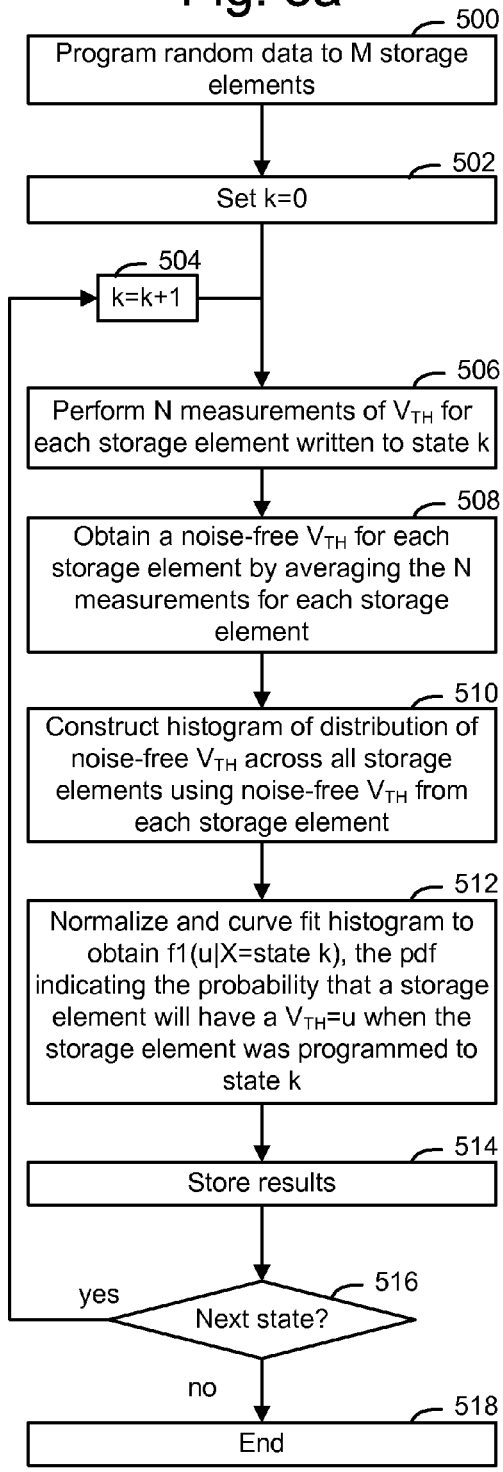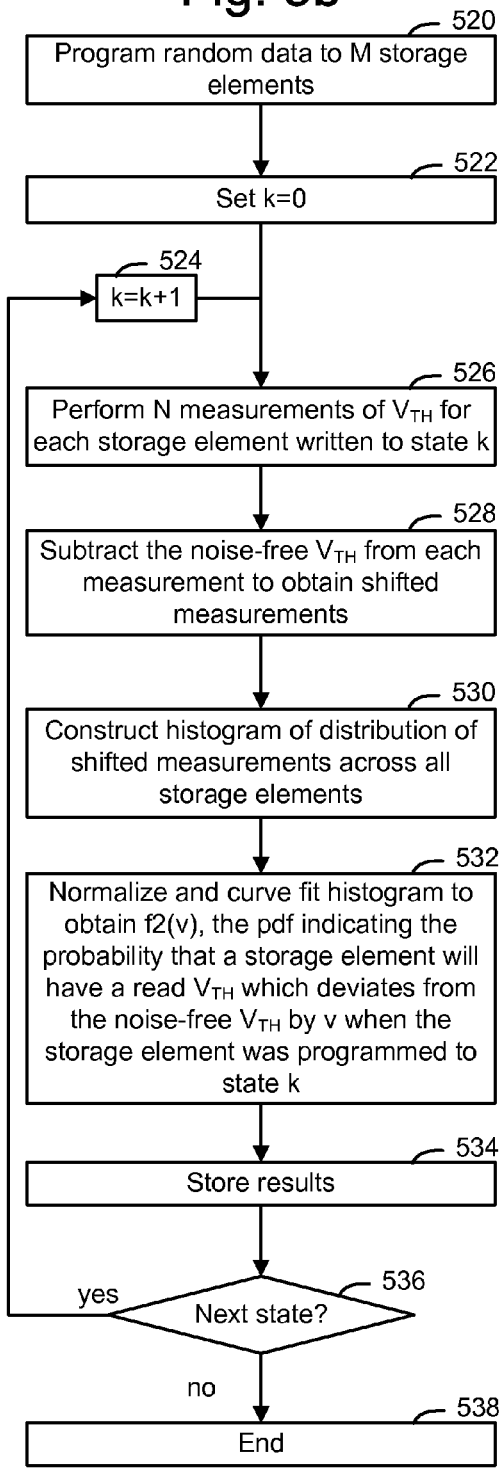

Fig. 6d

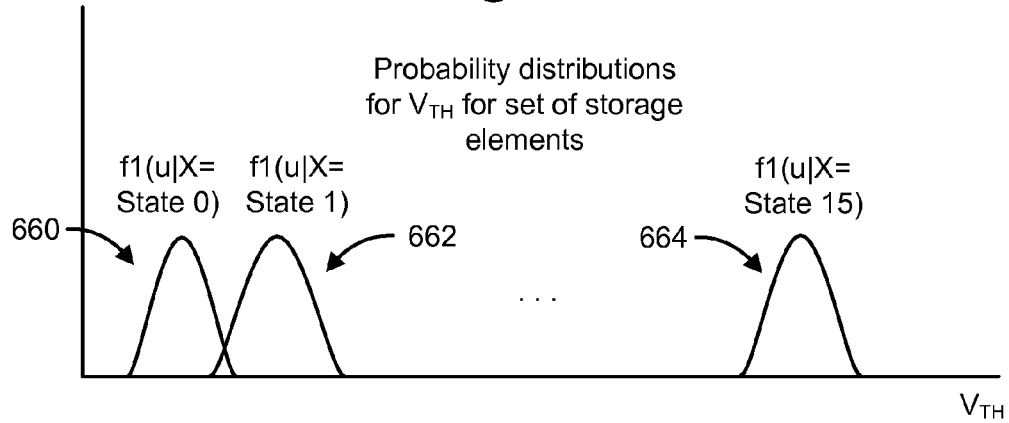

Probability distributions for $V_{TH}$ for set of storage elements f1(u|X= State 0) 660
f1(u|X= State 1) 662
f1(u|X= State 15) 664

Distribution of (measured $V_{TH}$ - Noise-free $V_{TH}$) for single state for single storage element

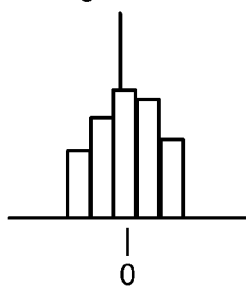

Distribution of (measured $V_{TH}$ - Noise-free $V_{TH}$) for single state for set of storage elements

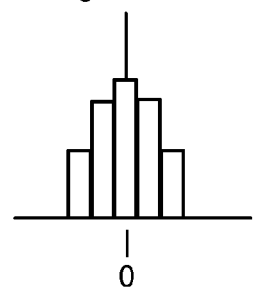

Probability distribution (f2(v)) for State 0

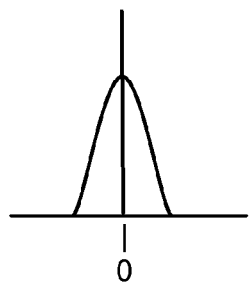

Probability distribution (f2(v)) for State 1

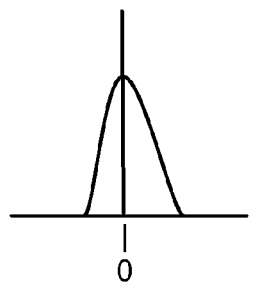

Probability distribution (f2(v)) for State 15

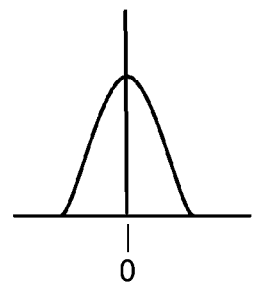

| Programmed State: | | | | | | | | | | | | | | | | |
|---|---|---|---|---|---|---|---|---|---|---|---|---|---|---|---|---|
| Bit position: | 0 | 1 | 2 | 3 | 4 | 5 | 6 | 7 | 8 | 9 | 10 | 11 | 12 | 13 | 14 | 15 |
| Top    | 1 | 0 | 0 | 1 | 1 | 0 | 0 | 1 | 1 | 0 | 0 | 1 | 1 | 0 | 0 | 1 |
| Higher | 1 | 1 | 0 | 0 | 0 | 0 | 1 | 1 | 1 | 1 | 0 | 0 | 0 | 0 | 1 | 1 |
| Upper  | 1 | 1 | 1 | 1 | 0 | 0 | 0 | 0 | 0 | 0 | 0 | 0 | 1 | 1 | 1 | 1 |
| Lower  | 1 | 1 | 1 | 1 | 1 | 1 | 1 | 1 | 0 | 0 | 0 | 0 | 0 | 0 | 0 | 0 |

Bit values

Fig. 9b

| First read result, Y1 | | | | | | | | | | | | | | | | |
|---|---|---|---|---|---|---|---|---|---|---|---|---|---|---|---|---|
| Bit position: | 0 | 1 | 2 | 3 | 4 | 5 | 6 | 7 | 8 | 9 | 10 | 11 | 12 | 13 | 14 | 15 |
| Top    | $-M_1$ | $M_1$ | $M_1$ | $-M_1$ | $-M_1$ | $M_1$ | $M_1$ | $-M_1$ | $-M_1$ | $M_1$ | $M_1$ | $-M_1$ | $-M_1$ | $M_1$ | $M_1$ | $-M_1$ |
| Higher | $-M_2$ | $-M_1$ | $M_1$ | $M_2$ | $M_2$ | $M_1$ | $-M_1$ | $-M_2$ | $-M_2$ | $-M_1$ | $M_1$ | $M_2$ | $M_2$ | $M_1$ | $-M_1$ | $-M_2$ |
| Upper  | $-M_3$ | $-M_3$ | $-M_2$ | $-M_1$ | $M_1$ | $M_2$ | $M_3$ | $M_3$ | $M_3$ | $M_3$ | $M_2$ | $M_1$ | $-M_1$ | $-M_2$ | $-M_3$ | $-M_3$ |
| Lower  | $-M_3$ | $-M_3$ | $-M_3$ | $-M_3$ | $-M_3$ | $-M_3$ | $-M_2$ | $-M_1$ | $M_1$ | $M_2$ | $M_3$ | $M_3$ | $M_3$ | $M_3$ | $M_3$ | $M_3$ |

Initial LLRs after first read

Fig. 9c

| Second read result, Y2 | | | | | | | | | | | | | | | | |
|---|---|---|---|---|---|---|---|---|---|---|---|---|---|---|---|---|
| Bit position: | 0 | 1 | 2 | 3 | 4 | 5 | 6 | 7 | 8 | 9 | 10 | 11 | 12 | 13 | 14 | 15 |
| Top    | | | | | | | | | | | | | | | | |
| Higher | | | | Adjustments to current LLR used by decoder | | | | | | | | | | | |
| Upper  | | | | | | | | | | | | | | | | |
| Lower  | | | | | | | | | | | | | | | | |

Top bit

Higher bit

Upper bit

Lower bit

Sparse parity check matrix H, 1200

Variable nodes

|  | v1 | v2 | v3 | v4 | v5 | v6 | v7 | v8 | v9 | v10 | v11 | v12 | v13 |
|---|---|---|---|---|---|---|---|---|---|---|---|---|---|
| cn1 |  | 1 |  | 1 |  |  |  |  |  |  | 1 |  | 1 |
| cn2 | 1 |  |  |  |  |  | 1 |  |  |  |  | 1 |  |
| cn3 |  |  | 1 |  | 1 | 1 |  |  | 1 | 1 |  |  |  |
| cn4 |  | 1 |  |  |  |  |  | 1 |  |  | 1 |  |  |
| cn5 |  |  |  | 1 |  | 1 |  |  |  |  |  | 1 |  |
| cn6 | 1 |  |  |  | 1 | 1 |  | 1 |  |  |  |  |  |
| cn7 |  | 1 |  |  |  |  |  | 1 |  | 1 |  |  | 1 |
| cn8 |  |  |  | 1 |  |  | 1 |  |  |  | 1 | 1 |  |
| cn9 | 1 | 1 |  | 1 |  |  |  |  |  |  |  |  | 1 |
| cn10 |  |  |  |  |  |  | 1 | 1 | 1 | 1 |  |  |  |

Check nodes

Sparse bipartite graph, 1300

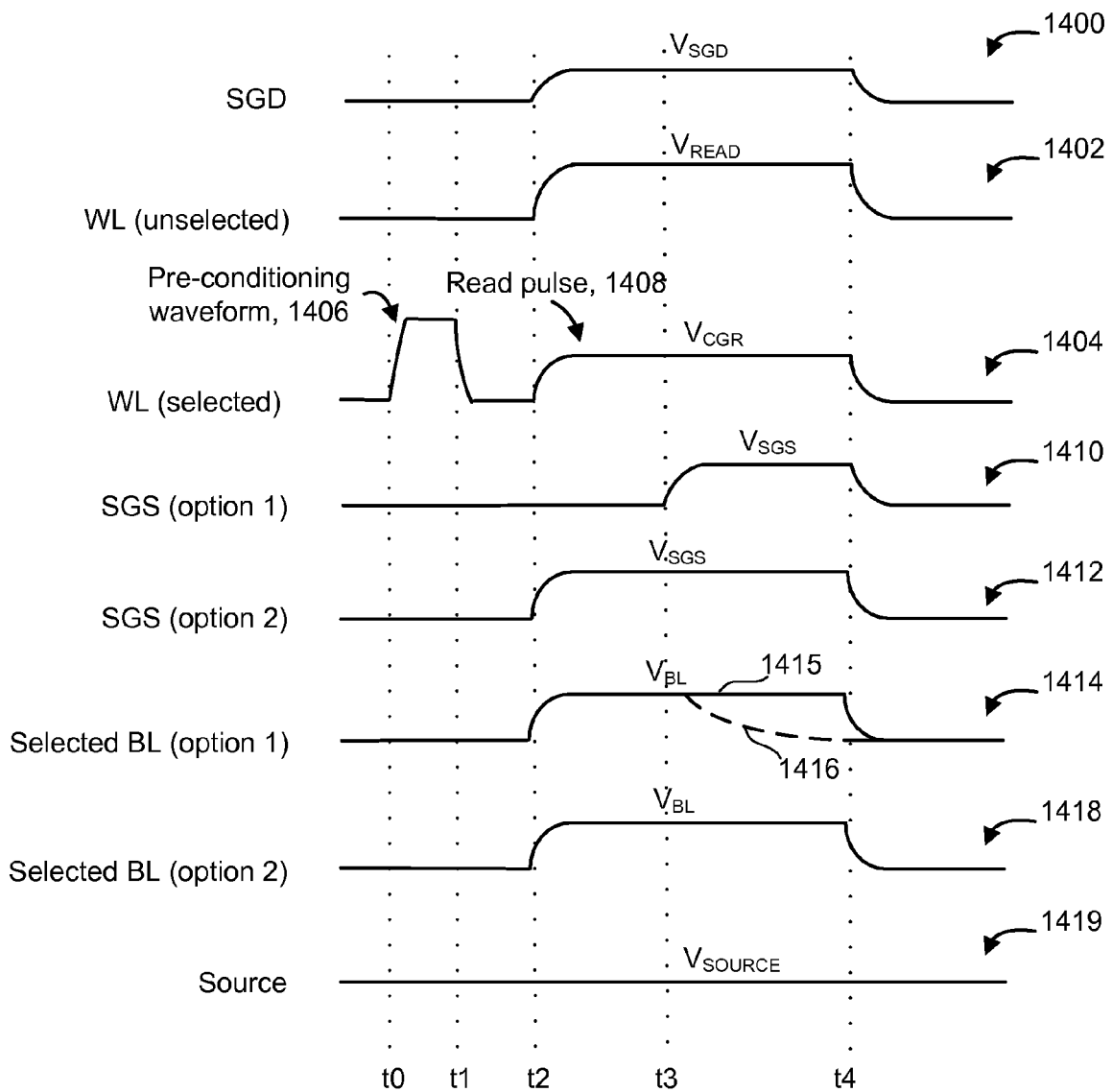

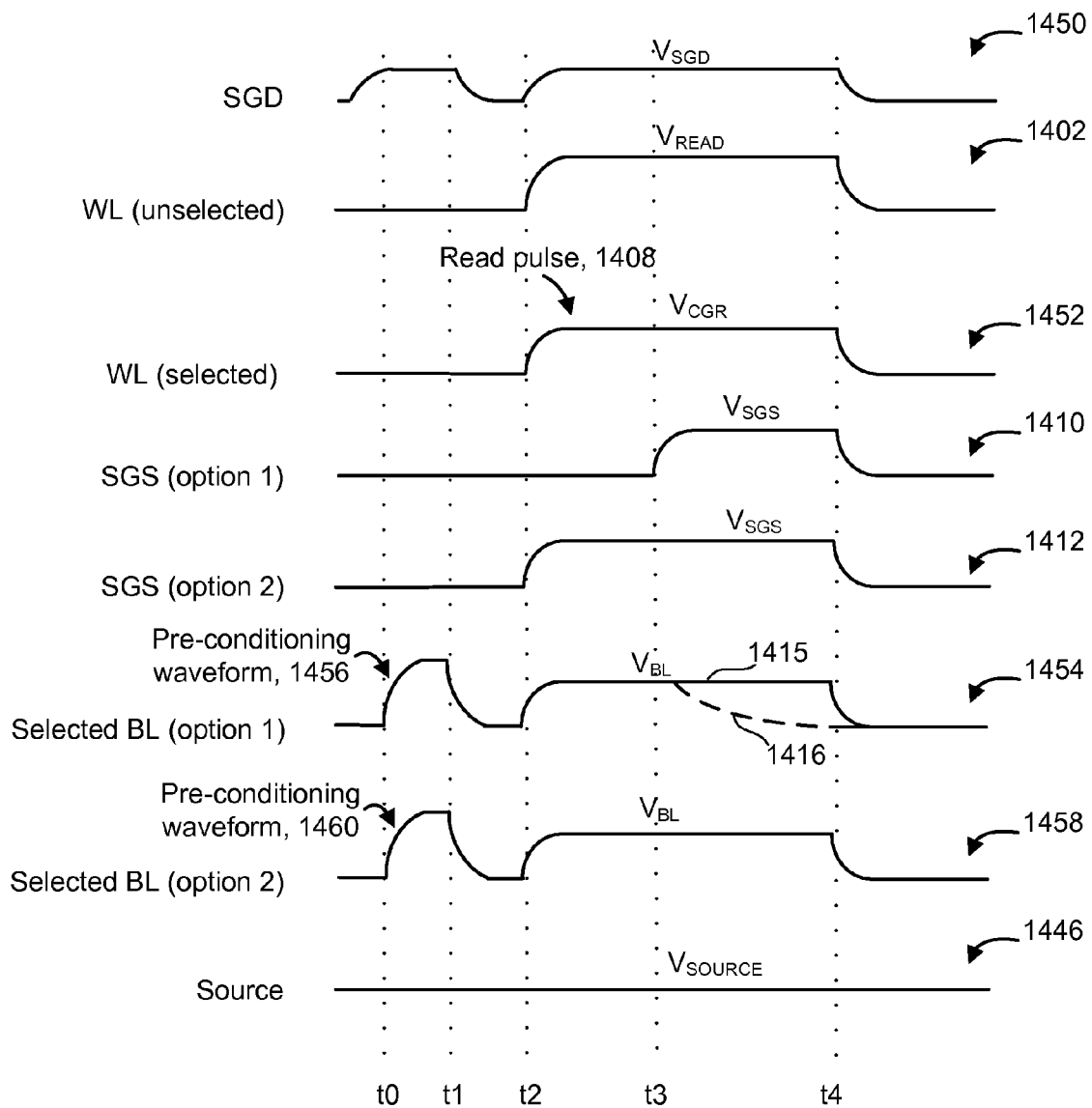

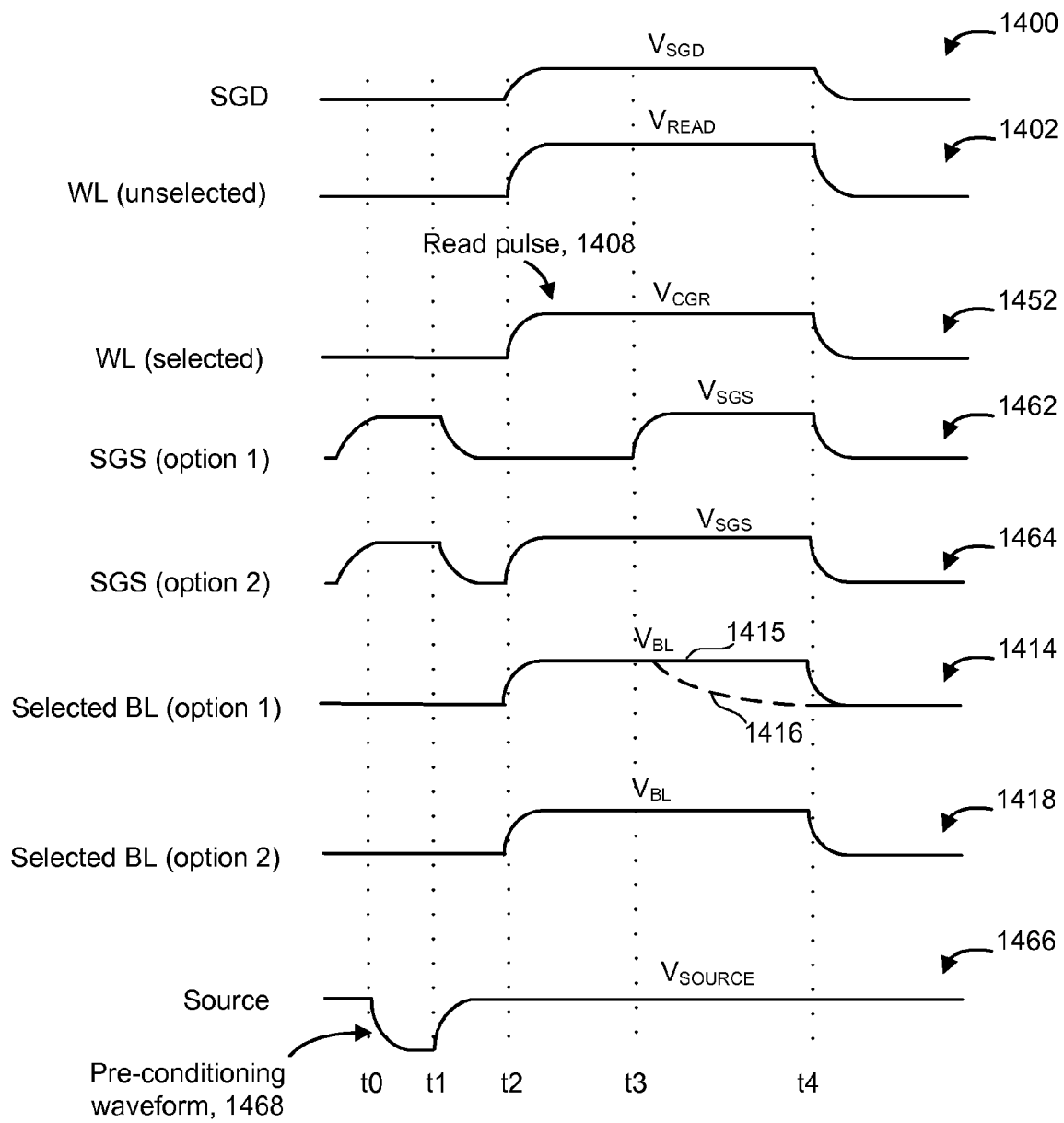

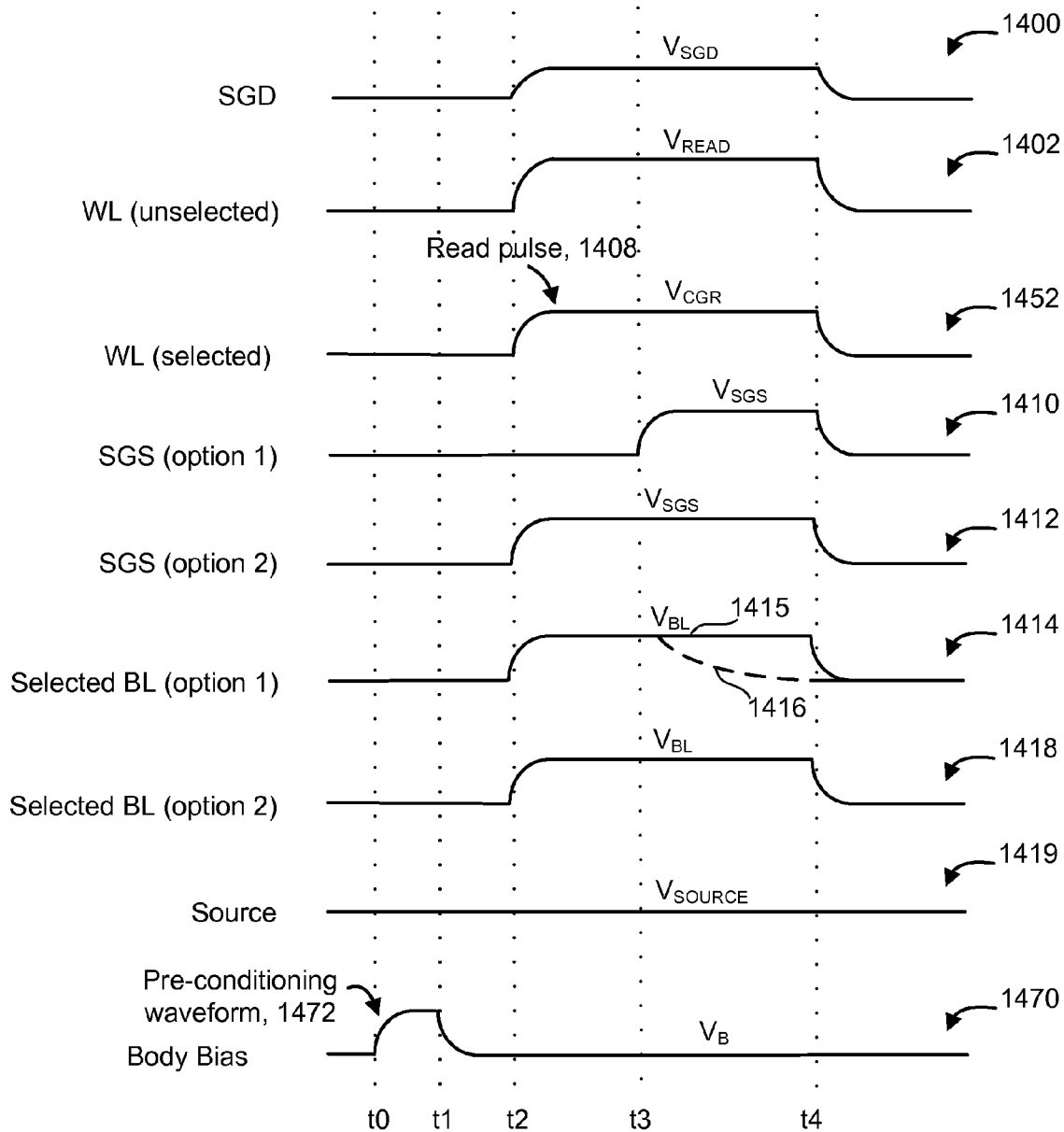

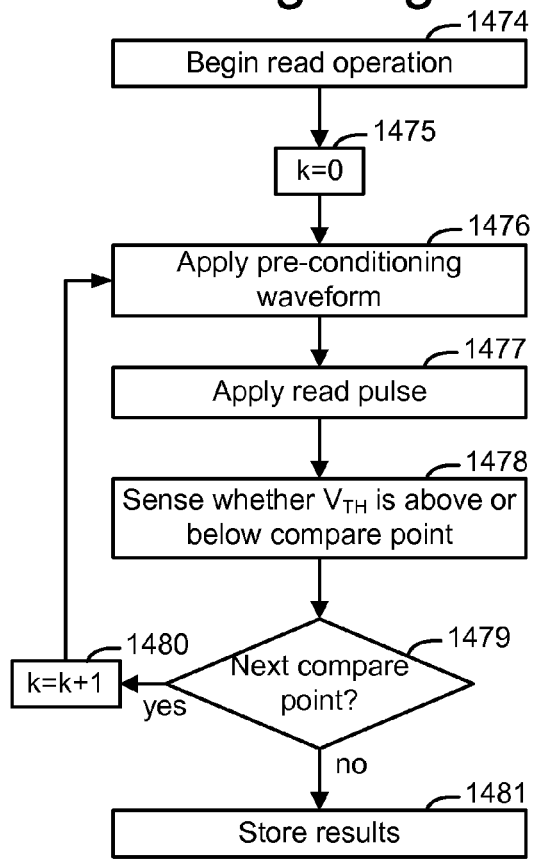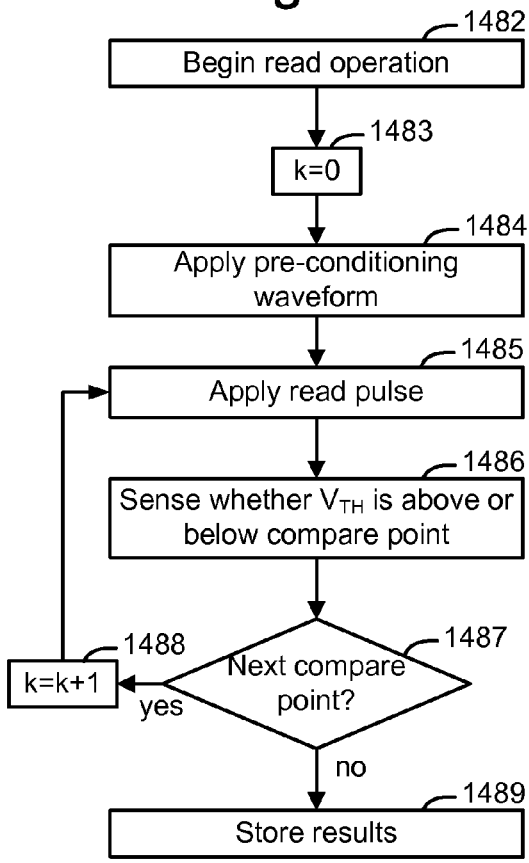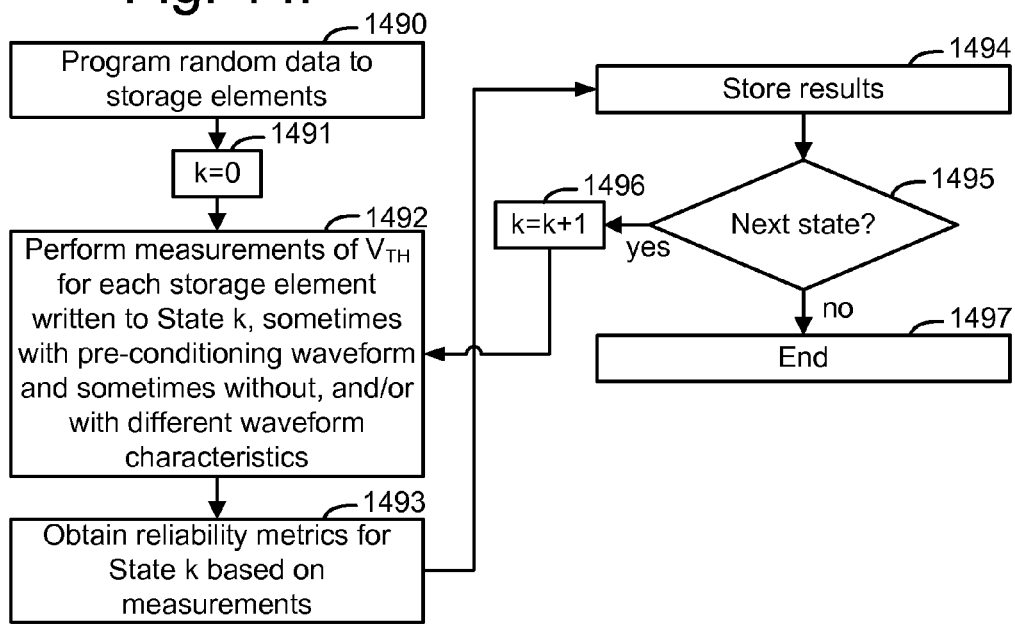

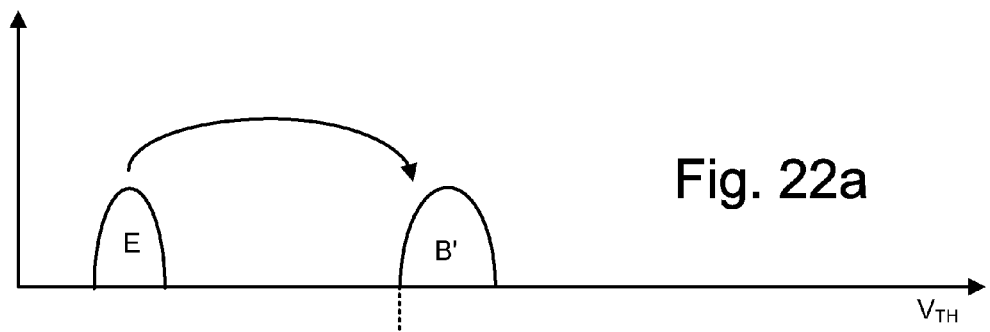
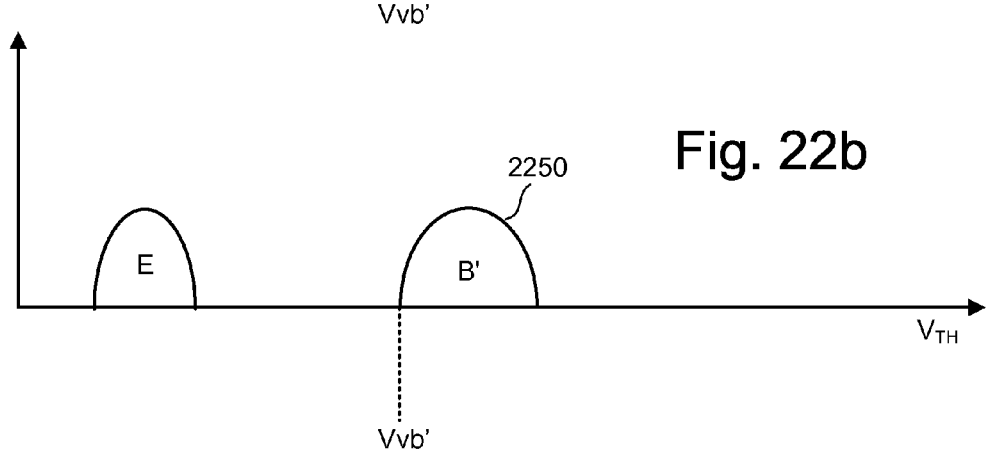
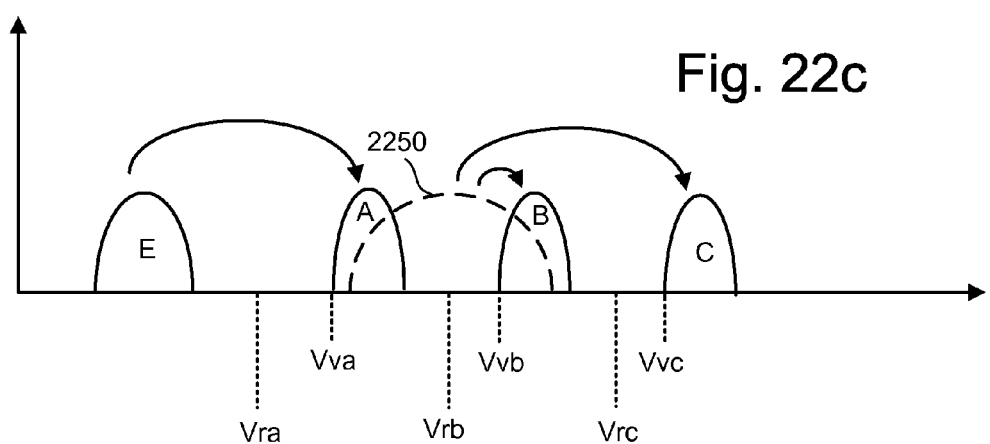

US 7,797,480 B2

METHOD FOR READING NON-VOLATILE STORAGE USING PRE-CONDITIONING WAVEFORMS AND MODIFIED RELIABILITY METRICS

CROSS-REFERENCE TO RELATED APPLICATIONS

This application is related to commonly assigned: U.S. patent application Ser. No. 11/693,668, filed herewith on Mar. 29, 2007 (now abandoned), titled "Non-Volatile Storage With Reading Using Pre-Conditioning Waveforms and Modified Reliability Metrics"; U.S. patent application Ser. No. 11/693,640, filed herewith on Mar. 29, 2007, published as US2008/0250300 on Nov. 9, 2008, titled "Method for Decoding Data in Non-Volatile Storage Using Reliability Metrics Based On Multiple Reads"; and U.S. patent application Ser. No. 11/693,672, filed herewith on Mar. 29, 2007 (now abandoned), titled "Non-Volatile Storage With Decoding of Data Using Reliability Metrics Based On Multiple Reads", each of which is incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

Once a non-volatile storage element has been programmed, it is important that its programming state can be read back with a high degree of reliability. However, the sensed programming state can sometimes vary from the intended programming state due to trap site noise and other factors. Perhaps the most important source of noise is 1/f noise (including random telegraph signal noise) which is a result of electron trapping and de-trapping into trap sites located in the tunnel oxide or elsewhere.

SUMMARY OF THE INVENTION

The present invention addresses the above and other issues by providing a method for reading non-volatile storage using pre-conditioning waveforms.

In one embodiment, a method for operating non-volatile storage includes applying at least a first pre-conditioning waveform to at least one non-volatile storage element in association with a first read operation, performing the first read operation on the at least one non-volatile storage element, performing a second read operation on the at least one non-volatile storage element, and determining a programming state of the at least one non-volatile storage element responsive to the first and second read operations.

In another embodiment, a method for operating non-volatile storage includes applying at least a first pre-conditioning waveform to at least one non-volatile storage element prior to, and in association with, a first read operation, performing the first read operation on the at least one non-volatile storage element, applying at least a second pre-conditioning waveform to the at least one non-volatile storage element prior to, and in association with, a second read operation, performing the second read operation on the at least one non-volatile storage element, and determining a programming state of the at least one non-volatile storage element responsive to the first and second read operations.

In another embodiment, a method for operating non-volatile storage includes performing a plurality of sense operations on a set of non-volatile storage elements for each of a plurality of programming states, where at least one pre-conditioning waveform is provided for at least a first of the sense operations, providing a set of reliability metrics based on the sense operations, and storing the set of reliability metrics for use by an iterative probabilistic decoding process in determining a programming state of at least one non-volatile storage element in the set of non-volatile storage elements in at least one subsequent sense operation.

In another embodiment, a method for operating non-volatile storage includes applying at least a first pre-conditioning waveform to at least one non-volatile storage element in association with a first read operation, performing the first read operation on the at least one non-volatile storage element, and determining a programming state of the at least one non-volatile storage element responsive to the first read operation using iterative probabilistic decoding.

BRIEF DESCRIPTION OF THE DRAWINGS

FIG. 1 is a top view of a NAND string.

FIG. 2 is an equivalent circuit diagram of the NAND string of FIG. 1.

FIG. 5a is a flowchart of a process for obtaining a first probability density function f1 for a set of non-volatile storage elements.

FIG. 5b is a flowchart of a process for obtaining a second probability density function f2 for a set of non-volatile storage elements.

FIG. 6d depicts probability distributions of voltage threshold for different states of a set of non-volatile storage elements.

FIG. 7a depicts a distribution of voltage threshold deviations for an example state of a non-volatile storage element.

FIG. 7b depicts a distribution of voltage threshold deviations for an example state of a set of non-volatile storage elements.

FIG. 7c depicts a probability distribution of voltage threshold deviations for State 0 for a set of non-volatile storage elements.

FIG. 7d depicts a probability distribution of voltage threshold deviations for State 1 for a set of non-volatile storage elements.

FIG. 7e depicts a probability distribution of voltage threshold deviations for State 15 for a set of non-volatile storage elements.

FIG. 9a depicts a table which provides multi-bit code words for different programmed states of a non-volatile storage element.

FIG. 9b depicts a table which provides initial values of LLRs for each bit of a code word based on a first read result.

FIG. 9c depicts a table which provides adjustments to current values of LLRs used by a decoder for each bit of a code word based on a second read result.

FIG. 14a is a timing diagram that explains the behavior of certain waveforms during read/verify operations, where a pre-conditioning waveform is applied to a selected word line before an associated read pulse.

FIG. 14d is a timing diagram that explains the behavior of certain waveforms during read/verify operations, where a pre-conditioning waveform is applied to a drain of a selected storage element via a selected bit line before an associated read pulse.

FIG. 14e is a timing diagram that explains the behavior of certain waveforms during read/verify operations, where a pre-conditioning waveform is applied to a source of a selected storage element via a source line before an associated read pulse.

FIG. 14f is a timing diagram that explains the behavior of certain waveforms during read/verify operations, where a pre-conditioning waveform is applied to a selected storage element via a body bias before an associated read pulse.

FIG. 14g is a flowchart of a process for performing a read operation on a storage element, where pre-conditioning waveforms are applied to a storage element before associated read pulses.

FIG. 14h is a flowchart of a process for performing a read operation on a storage element, where a pre-conditioning waveform is applied to a storage element before a series of read pulses.

FIG. 14i is a flowchart of a process for obtaining reliability metrics using pre-conditioning waveforms for subsequent use in decoding.

FIGS. 22a-c show various threshold voltage distributions and describe a process for programming non-volatile memory.

DETAILED DESCRIPTION

The present invention provides a method for reading non-volatile storage using pre-conditioning waveforms.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
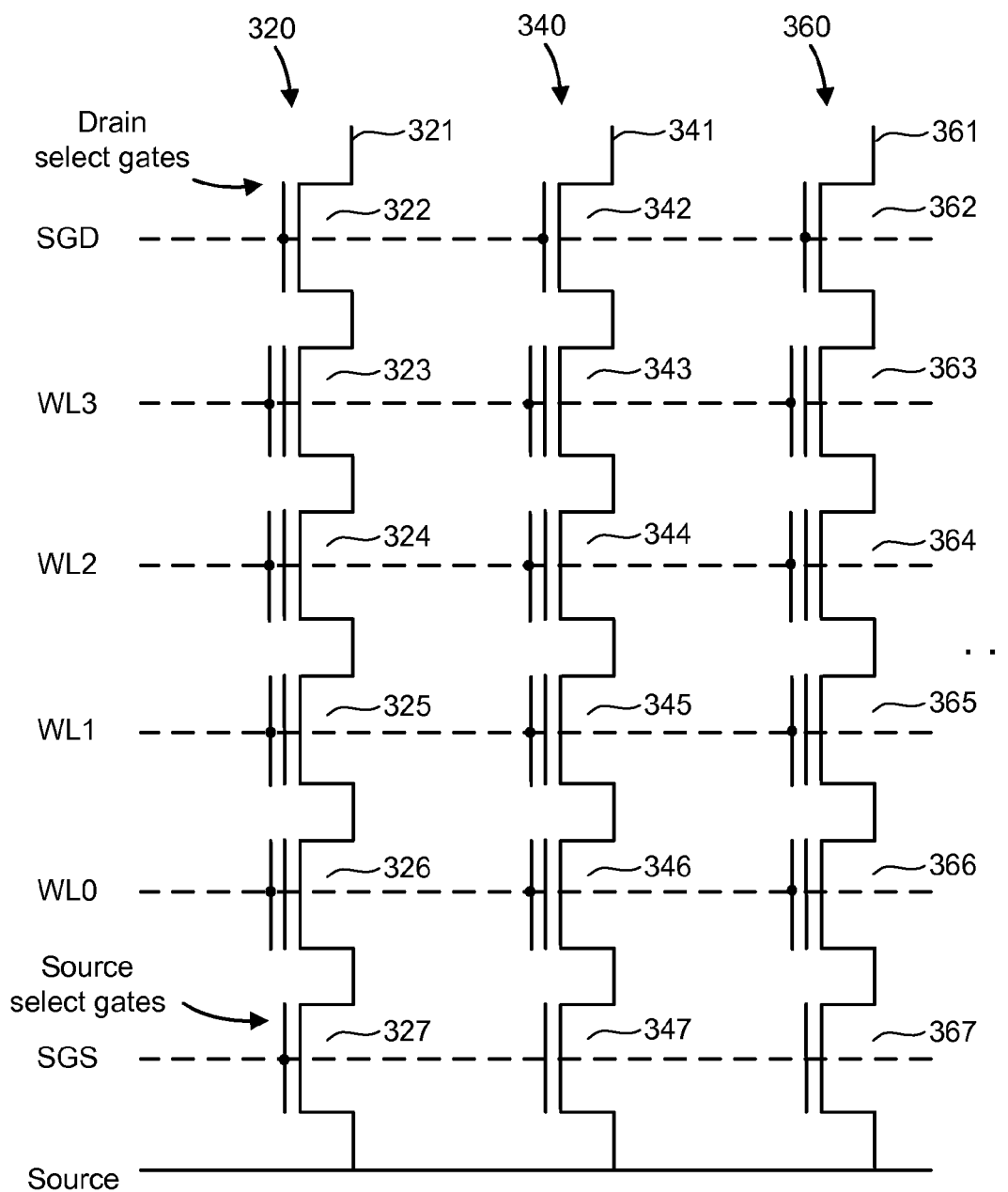
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
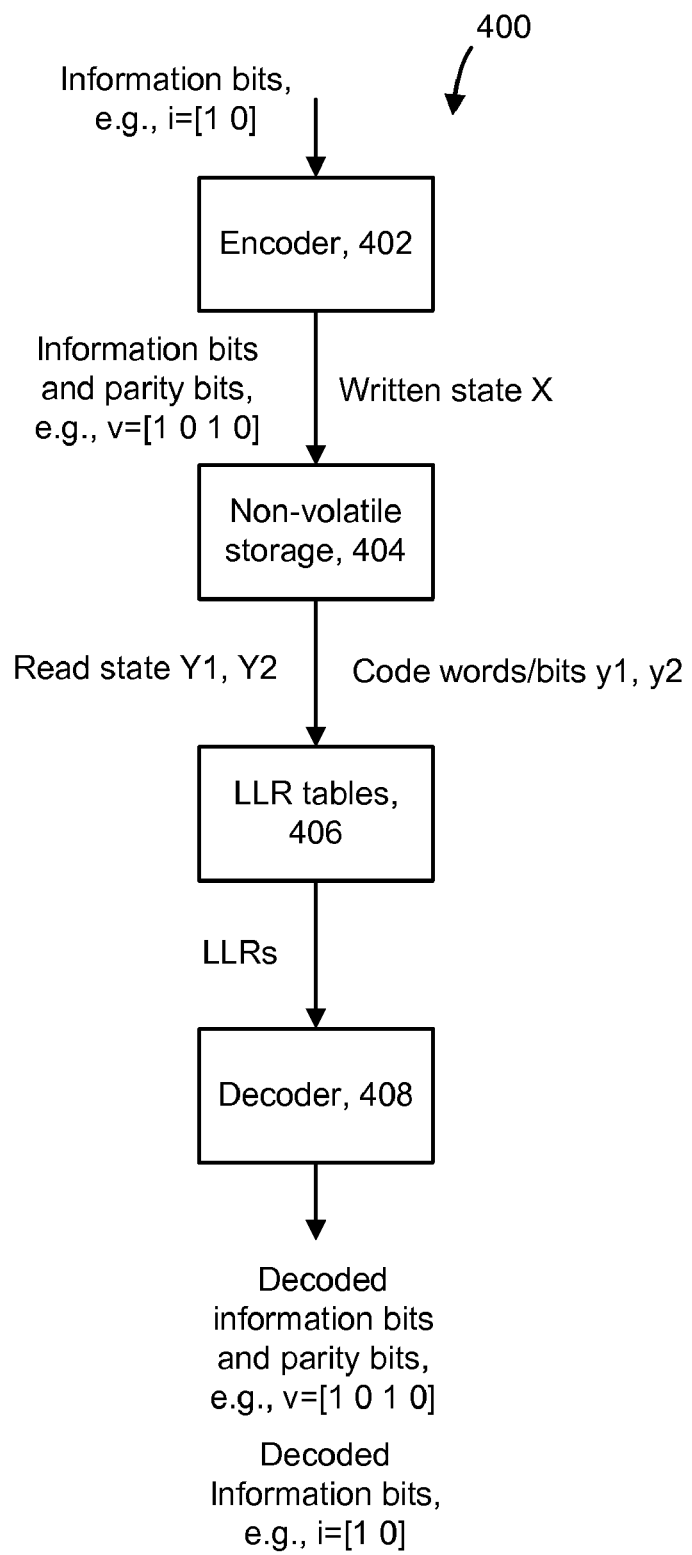
FIG. 4 depicts a system for encoding and decoding of data for non-volatile storage.

FIG. 4 depicts a system for encoding and decoding of data for non-volatile storage. Data which is stored in non-volatile storage can be encoded and decoded in a way which mitigates the effects of noise. Perhaps the most important source of noise is the 1/f noise (including random telegraph signal noise) which is a result of electrons trapping and de-trapping into trap sites located in the tunnel oxide or elsewhere. The noise is not so much a result of the loss of the channel electron going into a trap site as it is due to the fact that the electron/hole in the charged trap site affects the flow of other electrons in the channel by the electric field that the charged trap site exerts on a region of the channel in its vicinity. Moreover, the region of the channel that is under the influence of a single trap site will form a larger portion of the channel as the storage elements are scaled down.

Many noisy storage elements suffer from a single trap site, and this conclusion is based on the binary nature of their current values, that is, a storage element has one current/$V_{TH}$ value if the trap is occupied and another distinct current/$V_{TH}$ value if the trap is unoccupied. Thus, when storage elements are biased under DC conditions equivalent to the read condition, many storage elements exhibit a bimodal distribution of current values with two narrow distributions having peaks that are substantially separated from each other. However, some storage elements suffer from more than a single noisy trap site. Moreover, not every trap site can lead to noisy behavior, as there may exist trap sites that are consistently empty or consistently occupied during read conditions. Also, trap sites which are in easy communication with some electrode, and as a result make a large number of transitions between being empty and being occupied during any single integration time (e.g., read period), will manifest little or no noise as their average effect is more or less the same for any integration time/measurement operation. This can be explained by the averaging concept or, more precisely, by the Central Limit Theorem. Also, the occupation probability of trap sites can be modulated by the electric field that the trap sites find themselves immersed in. Further, those trap sites that are more detrimental to read operations are those with longer occupation/inoccupation life times. Such trap sites can be thought of as parasitic memory devices that interfere with the normal operations of the memory. Write/erase cycles can and do create additional trap sites, and lead to more noise.

As a result, read operations can be impacted by noise in a storage element. Although error correction coding and decoding schemes can address some errors cause by noise and other factors, additional advantages can be achieved by performing multiple read operations as explained herein. An example approach is depicted in the encoding/decoding system of FIG. 4, which includes an encoder 402, non-volatile storage 404, LLR (log likelihood ratio) tables 406 and a decoder 408. The encoder 402 receives information bits, also referred to as user data, which is to be stored in the non-volatile storage 404. The information bits are represented by the matrix i=[1 0]. The encoder 402 implements an error correction coding process in which parity bits are added to the information bits to provide data represented by the matrix or code word v=[1 0 1 0], indicating that two parity bits have been appended to the data bits. This is a simplified example which results in a high parity bit overhead cost. In practice, codes with lower overhead can be used. For example, low density parity check (LDPC) codes, also referred to as Gallager codes, may be used. Such codes are typically applied to multiple code words which are encoded across a number of storage elements so that the parity bits are distributed among the storage elements. Further information regarding LDPCs can be found in D. MacKay, Information Theory, Inference and Learning Algorithms, Cambridge University Press 2003, chapter 47. The data bits can be mapped to a logical page and stored in the non-volatile storage 404 by programming a non-volatile storage element to a programming state, e.g., X=6, which corresponds to v (see FIG. 9a). With a four-bit data matrix v, sixteen programming states can be used.

Subsequently, when it is desired to retrieve the stored data, the non-volatile storage is read. However, due to noise, as mentioned, the read state can sometimes be errored. In one example approach, a first read Y1 yields the programming state 7 which is represented by the code word y1=[1 0 1 1], and a second read Y2 yields the programming state 6 which is represented by the code word y2=[1 0 1 0]. In one possible implementation, an iterative probabilistic decoding process is used which implements error correction decoding corresponding to the error correction encoding at the encoder 402. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not errored. In one approach, the probability metrics are logarithmic likelihood ratios (LLRs) which are obtained from LLR tables 406. LLR values are measures of the reliability with which we know the values of various binary bits read from storage elements.

The LLR for a bit is given by $$Q = \log_2 \frac{P(v=0|Y)}{P(v=1|Y)},$$

where P(v=0|Y) is the probability that a bit is a 0 given the condition that the read state is Y, and P(v=1|Y) is the probability that a bit is a 1 given the condition that the read state is Y. Thus, an LLR>0 indicates a bit is more likely a 0 than a 1, while an LLR<0 indicates a bit is more likely a 1 than a 0, based on one or more parity checks of the error correction code. Further, a greater magnitude indicates a greater probability or reliability. Thus, a bit with an LLR=20 is more likely to be a 0 than a bit with an LLR=10, and a bit with an LLR=−20 is more likely to be a 1 than a bit with an LLR=−10. LLR=0 indicates the bit is equally likely to be a 0 or a 1.

An LLR table 406 can be provided for each of the four bit positions in the codeword Y1 so that an LLR is assigned to each bit 0, 0, 1 and 0, respectively, of y1. Further, the LLR tables can account for the multiple read results so that an LLR of greater magnitude is used when the bit value is consistent in the different code words. Thus, an LLR with a greater magnitude can be assigned to the first bit in y1 than if only one read operation was performed. To illustrate, the first bit in y2 is 1, which is consistent with the first bit in y1. Likewise, an LLR of lesser magnitude is used when the bit value is inconsistent in the different code words. For example, the fourth bit in y2 is 0, which is inconsistent with the fourth bit in y1. Thus, an LLR with a lesser magnitude can be assigned to the fourth bit in y1 than if only one read operation was performed. Since more information is obtained from the additional read operations, the decoding process can be improved, e.g., so that it converges more quickly or converges in cases in which it would otherwise not converge if only one read operation was made. In another approach, the second read operation, or other additional read operations, are not performed unless the decoding process does not successfully converge, e.g., within a given amount of time or number of iterations.

The decoder 408 receives the code word y1 and the initial LLRs. As explained additionally further below (see also FIGS. 12 and 13), the decoder 408 iterates in successive iterations in which it determines if parity checks of the error encoding process have been satisfied. If all parity checks are satisfied initially, the decoding process has converged and the code word is not errored. If one or more parity checks have not been satisfied, the decoder will perform error correction by adjusting the LLRs of one or more of the bits which are inconsistent with a parity check and then reapply the parity check to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. Once the parity check in question has been satisfied, the next parity check, if applicable, is applied to the code word. The process continues in an attempt to satisfy all parity checks. Thus, the decoding process of y1 is completed to obtain the decoded information and parity bits v and the decoded information bits i.

Note that, in the example discussed, the code word y1 from the first read operation is decoded with assistance from one or more subsequent read operations. However, other approaches are possible. For example, the code word from a given read operation can be decoded with assistance from one or more prior read operations. Or, three read operations can be taken which determine two consistent results (e.g., both read state Y1) and one inconsistent result (e.g., state Y2), and the code word for the consistent result can be decoded with assistance from the inconsistent result. The LLR tables can be set accordingly.

In another option, the code word for the consistent result is decoded directly without assistance from the inconsistent result.

The examples discussed therefore include performing two or more reads in order to mitigate the effect of noise, and combining the results of these reads to modify the LLR numbers pertaining to the state of each storage element. When the iteration process of the ECC decoder takes too long to reach convergence, another read operation can be performed. The decoding can continue or can be paused while the additional read is performed. Or, the additional read can be performed automatically regardless of the progress of the decoding. After the second read operation is complete, the LLR signed magnitudes from the first read operation can be updated based on the second read operation. In one approach, LLR values be added or otherwise combined from different read operations. For instance, consider a noisy storage element whose LLR values are 10 and −10 for a given bit for the first and second read operations. Such a table receives the read state as an input and outputs an LLR value for each bit in the code word which represents the read state. After these two contradictory results are obtained, an LLR of 0, for instance, may be used for the decoding. The decoding engine will set this bit high or low in order to attain convergence.

Performing more than two read operations is also possible. One approach is to add or to take the average or mean of LLR results from all reads. For example, LLR values may be 20, 10 and −10 for a given bit for the first, second and third read operations, respectively, in which case the average is 6.6. This is a simplified approach which is expedient. Other approaches can take into account the fact that an LLR of 20 indicates more that twice the probability of a given result than an LLR of 10 so that, e.g., LLRs of 10 and 20 are combined to an LLR closer to 20 than 10.

Also, by the time the results of the second read operation have become available, the iteration process may have advanced, and many LLR values may have been updated in the attempt to converge. The results of the second read can therefore be combined with the real time iterated results of the first read that are currently available or with original results of the first read, or a hybrid approach can be used.

Further, if every one of the read operations yields the same result, for a given bit, we can assign a higher magnitude LLR for the bit. This peak LLR (LLRpeak) could be slightly higher than the LLR that would be gained from only a single read (LLRsingle). If the series of reads yields differing results, then a lower final LLR could result. One method of aggregating a series of reads is to take the average of the single-read LLRs and multiplying it by a normalization factor such as LLRpeak/LLRsingle, so that Final LLR=Averaged LLR of multiple reads×|LLRpeak/LLRsingle|

In an actual implementation, iteration for convergence based on the first read result can begin before the second read results are obtained. Once the second read result and, in general, all subsequent read results are obtained, one strategy for incorporating the subsequent read results into the iteration process is to presume that all the raw results as read from the storage elements are still available. In this case, we may simply interrupt the current iteration and begin anew with Final LLR as calculated above. Another strategy for aggregating LLR values is to combine newly acquired read results with the current iterated LLR values. This could be done, e.g., by weighting the nth read result by 1/(n−1) relative to the previous results, so that all read results are weighted equally.

Which strategy is more appropriate could be determined by how well the current iteration is proceeding. The "goodness" of the iteration can be measured by a quality metric, such as whether or not the iterative decoding process approaches convergence within a given time period and/or a given number of iterations, and/or a specific number of parity checks have been satisfied. Further, the metric can be used in a real-time adaptive decision process during the decoding, e.g., by choosing to continue the current decoding process, without performing an additional read, continue the decoding while adjusting the most recently used LLRs based on an additional read, or restarting the decoding with new initial LLRs based on an additional read.

LLRs or other probabilistic metrics can be developed, e.g., by obtaining probability density functions of the programmed states of a set of non-volatile storage elements, as follows.

FIG. 5*a* is a flowchart of a process for obtaining a first probability density function f1 for a set of non-volatile storage elements. Step 500 includes programming random data to all storage elements in a set of M storage elements. That is, assuming the storage elements are multi-level storage elements with n levels or programming states, after the programming, about M/n of the storage elements are programmed to a first state, M/n are programmed to a second state, and so forth. For instance, n=16 states in one possible approach, where each state is represented by a four-bit code word. At step 502, index k, which represents a kth programming state, is initialized to zero. Step 506 includes making N repeated measurements of the $V_{TH}$ for each storage element written to state k, where N is a large number such as one hundred. These are measurements which are made in a test environment to a higher degree of accuracy than is used during production use of the storage device.

Figure 6A:
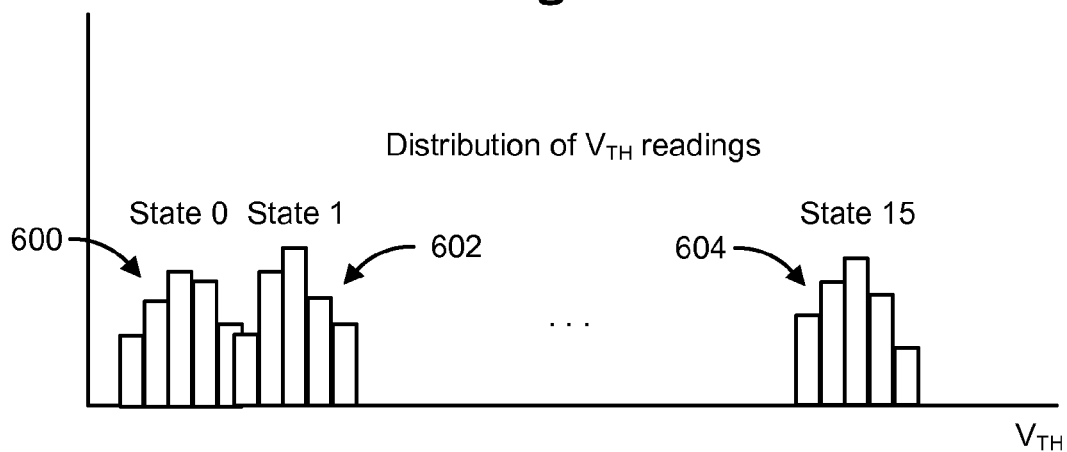
FIG. 6a depicts a distribution of voltage threshold readings.
Figure 6B:
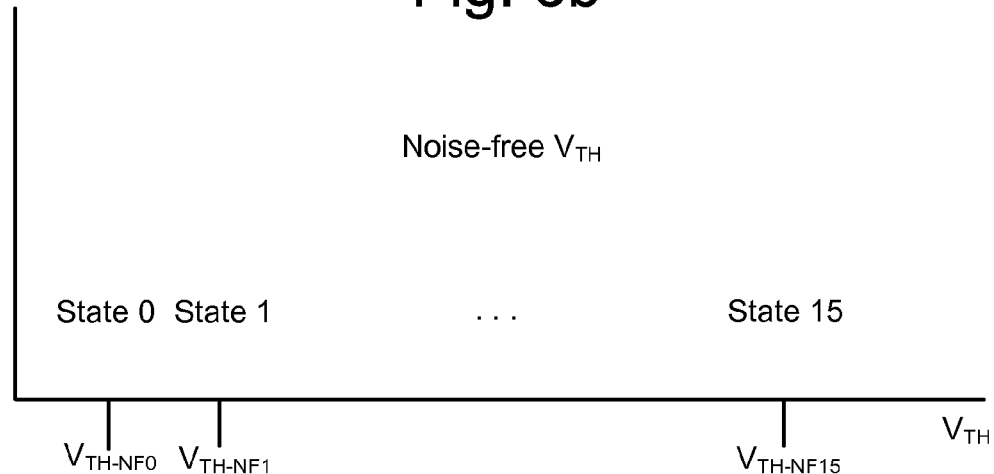
FIG. 6b depicts noise-free voltage threshold readings.

Step 508 includes obtaining a noise-free $V_{TH}$ for each storage elements by averaging the N measurements for each storage element. This results in about M/n noise-free $V_{TH}$ values over the set of storage elements. For example, FIG. 6a depicts a distribution of voltage threshold readings. For state 0, for instance, the histogram 600 shows the number of readings which fell into different ranges or buckets of $V_{TH}$ for an example first storage element Histogram 602 is for state 1 for an example second storage element and histogram 604 is for state 15 for an example third storage element. Histograms for the intermediate states are not depicted. FIG. 6b depicts noise-free voltage threshold readings. For example, $V_{TH-NF0}$, $V_{TH-NF1}$, ..., $V_{TH-NF15}$ represent the noise-free voltage threshold readings for states 0, 1, ..., 15, respectively, for the example first, second and third storage element. Note that the raw $V_{TH}$ readings can be averaged as well instead of using the histograms of FIG. 6a. Further, statistical techniques other than averaging can be used.

Figure 6C:
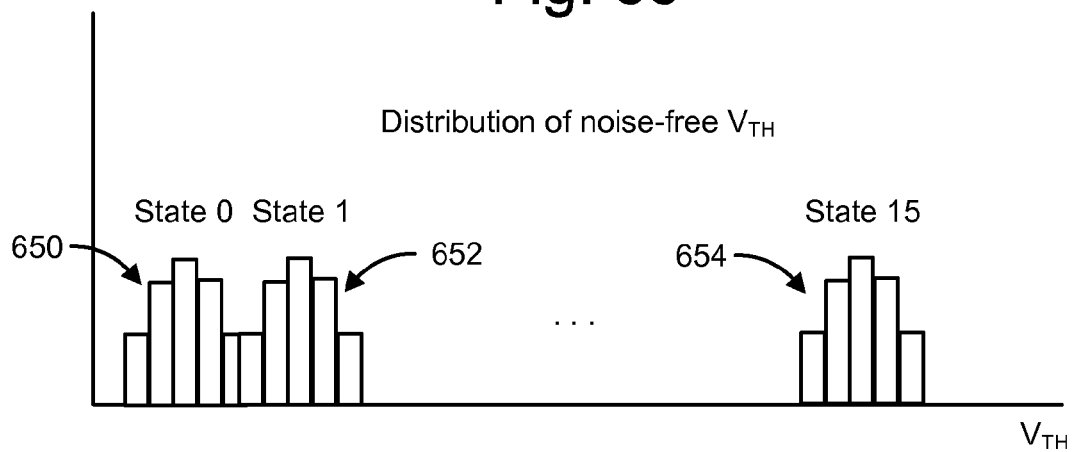
FIG. 6c depicts a distribution of noise-free voltage threshold readings.

Step 510 (FIG. 5a) includes constructing a histogram of the distribution of the noise-free $V_{TH}$ across all storage elements in the set which were programmed to state k, using the noise-free $V_{TH}$ from each storage element. For example, FIG. 6c depicts a distribution of noise-free voltage threshold readings, e.g., readings which hare free from read noise. Other noise may still be present. For state 0 for the example first storage element, for instance, the histogram 650 shows the number of readings which fell into different ranges or buckets of $V_{TH}$. Histogram 652 is for state 1 for the example second storage element and histogram 654 is for state 15 for the example third storage element. Histograms for the intermediate states are not depicted. These histograms are bar charts indicating how many of the M storage element cells have a $V_{TH}$ in the designated ranges. Step 512 includes normalizing and curve fitting the histogram to obtain f1(u|X=state k), a probability density function (pdf) indicating the probability that a storage element will have a $V_{TH}$=u, when the storage element was programmed to state k. For example, with k=0, the function f1(u|X=0) is the probability that if we randomly selected a storage element from the memory chip, where the storage element had been programmed (written) to state 0, its noise-free $V_{TH}$ will be u. Normalizing the histogram (e.g., one of the histograms 650, 650, ..., 654) can including dividing the height of the bar chart by M so that the sum of the heights of every bar for a given state is one.

At step 514, the results are stored, e.g., including data defining the function f1(u|X=state k). If a next state is to be analyzed at decision step 516, the state index is incremented at step 504 and processing proceeds again at steps 506-514. This processing is repeated for all memory states. The process ends at step 518 at which time the pdfs f1(u|X=0), f1(u|X=1), f1(u|X=2), f1(u|X=3), ... f1(u|X=n) have been obtained, where n+1 is the number of states. FIG. 6d depicts probability distributions of voltage threshold for different states of a set of non-volatile storage elements. Here, example distributions 660 for f1(u|X=0), 662 for f1(u|X=0), ... and 664 for f1(u|X=15) are depicted, where there are sixteen states. Distributions for the intermediate states are not depicted.

FIG. 5b is a flowchart of a process for obtaining a second probability density function f2 for a set of non-volatile storage elements. Steps 520, 522 and 526 correspond to steps 500, 502 and 506 of FIG. 5a. Further, these steps can be repeated relative to the corresponding steps of FIG. 5a, or the results from steps 500, 502 and 506 of FIG. 5a can be used starting at step 528 of FIG. 5b. Step 528 includes subtracting the noise-free $V_{TH}$ from each measurement to obtain shifted measurements. For example, FIG. 7a depicts a histogram of such shifted measurements or deviations from the noise-free $V_{TH}$. Step 530 includes constructing a histogram of the distribution of the shifted measurements across all storage elements which were programmed to state k. FIG. 7b depicts an example of such a histogram. Step 532 includes normalizing and curve fitting the histogram to obtain a function f2(v), which is the pdf indicating the probability that a storage element will have a read $V_{TH}$ which deviates from the noise-free $V_{TH}$ by v when the storage element was programmed to state k. The function f2(v) is the probability that if we randomly selected a storage element from the memory chip and made a single measurement, the resultant $V_{TH}$ is a distance "v" away from the "true" or "noise-less" $V_{TH}$. FIGS. 7c-7e depicts examples of f2(v) for different states. Specifically, FIG. 7c depicts a probability distribution of voltage threshold deviations for State 0, FIG. 7d depicts a probability distribution of voltage threshold deviations for State 1, and FIG. 7e depicts a probability distribution of voltage threshold deviations for State 15. Note that the figures indicate that it is possible for the distributions to differ somewhat. The distributions of f1 can similarly differ.

At step 534, the results are stored, e.g., including data defining the function f2(v). If a next state is to be analyzed at decision step 536, the state index is incremented at step 524 and processing proceeds again at steps 526-534. This processing is repeated for all memory states. The process ends at step 538, at which time the pdf f2(v) has been obtained for all states.

Note that the pdfs can vary with the age/cycling of the memory device as the noise free $V_{TH}$ distribution can change. The measurements of $V_{TH}$ which are used to obtain the pdfs can be performed at different device ages and averaged, for instance, to obtain pdfs, and resulting LLRs, which are representative of an average device age.

Figure 8:
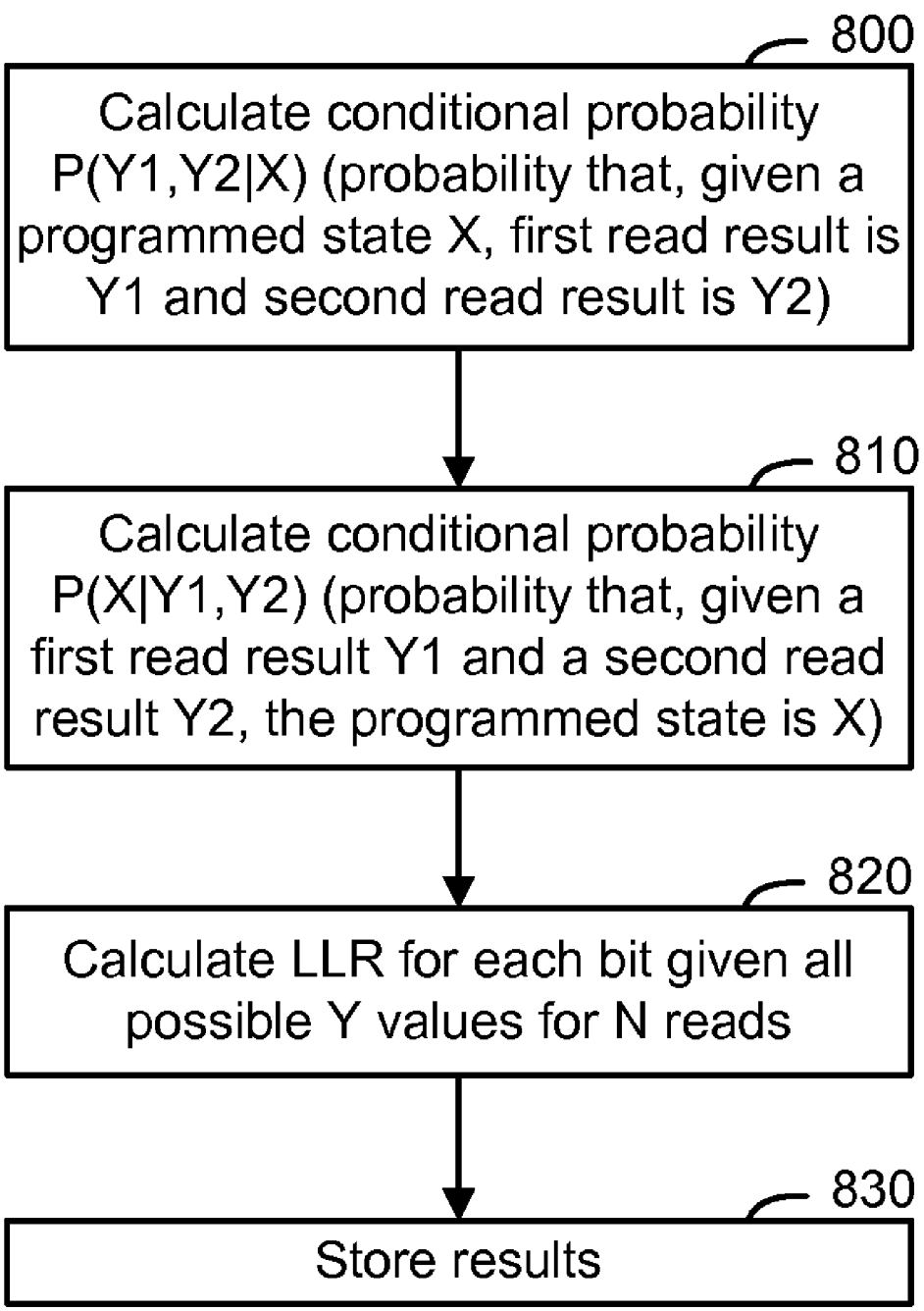
FIG. 8 is a flowchart of a process for obtaining logarithmic likelihood ratios (LLRs) for use in decoding read data from a non-volatile storage element.
Figure 10A:
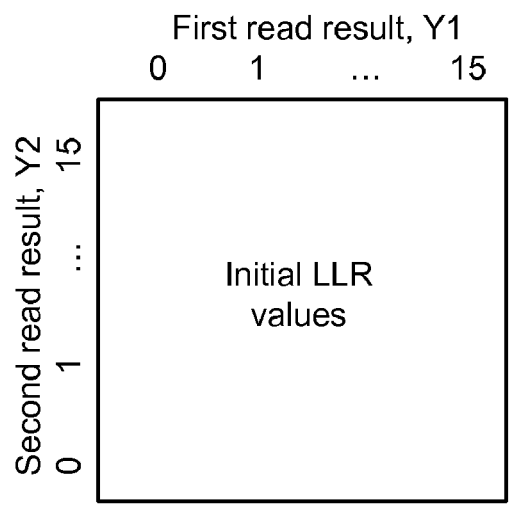
FIG. 10a-d depict tables which provide initial values of LLRs for each bit of a code word based on first and second read results.
Figure 10B:
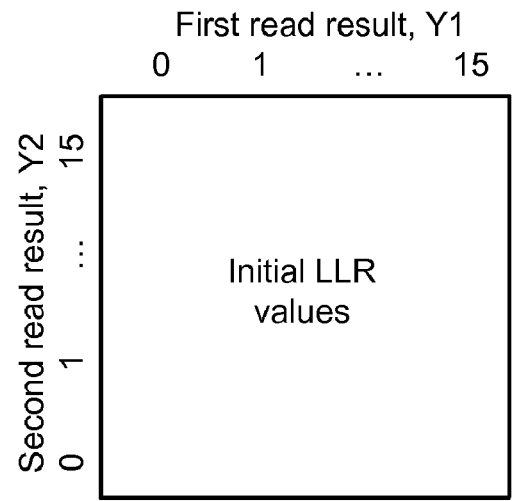
Figure 10C:
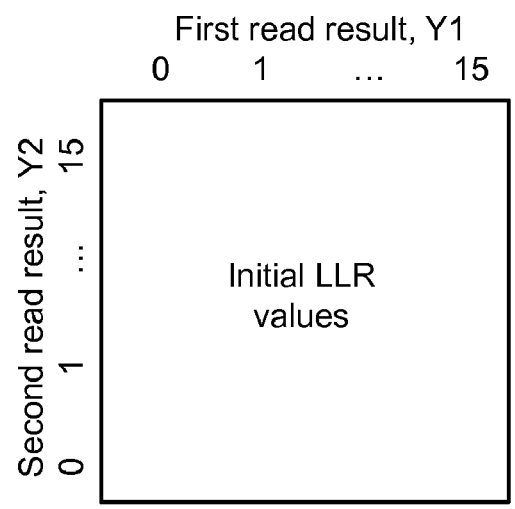
Figure 10D:
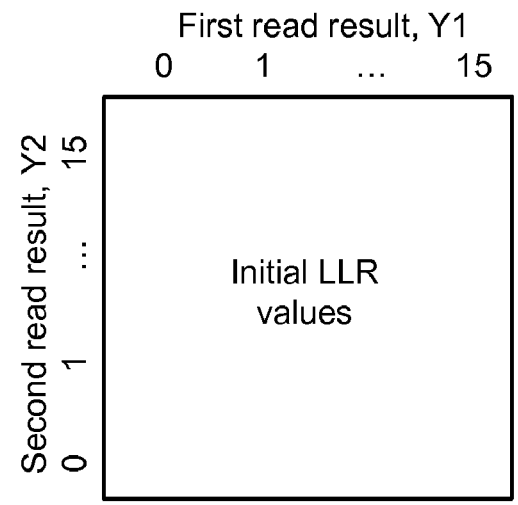

FIG. 8 is a flowchart of a process for obtaining logarithmic likelihood ratios (LLRs) for use in decoding read data from a non-volatile storage element. At step 800, based on f1(u) and f2(v), we calculate the conditional probability $P(Y_1, Y_2|X)$. This is the probability that, given that state X as written to a storage element, the first read yields $Y_1$, the second read yields $Y_2$, and so forth. The probability can be expressed in the form $P(Y_1,Y_2|X)$ when there are two read operations, or generally $P(Y_1,Y_2,...,Y_N|X)$ when there are N read operations. The probability can be determined for measurements in a test environment. At step 810, based on these probabilities and Bayes rule, we calculate P(X|Y1,Y2) when there are two read operations, or generally P(X|Y1,Y2,Y3,Y4...$Y_N$) when there are N read operations. P(X|Y1,Y2) is the probability that, give a first read result Y1 and a second read result Y2, the programmed state is X. Step 820 includes calculating an LLR for each bit given all possible y values for N reads, and step 830 includes storing the results, e.g., in one or more tables. That is, an LLR is assigned to each bit in each code word used to represent a programmed state. During operation of the memory device, the tables that are provided can be used to find initial LLR numbers for decoding, given the results of the multiple read operations, in one possible approach.

Note that the technique outlined here assumes independence between read-noise and the "noise-less" $V_{TH}$. The technique can be extended to encompass cases where the read-noise values and the "noise-less" $V_{TH}$ are not independent. This essentially involves constructing a joint pdf f(u, $v_1$, $v_2$, ... $v_n$) from experimental data.

FIG. 9a depicts a table which provides multi-bit code words for different programmed states of a non-volatile storage element. As mentioned previously, each programming state of a storage element can be represented by a code word. For example, with sixteen states, a four bit code word can be used. Further, an LLR or other reliability metric is associated with each bit indicating the probability that the bit is not errored (a higher magnitude LLR indicates a higher probability that the bit is not errored). FIG. 9a depicts bit values or code words in columns beneath the programmed states 0 through 15. The bits positions are depicted as top, higher, upper and lower. The lower bit is the most significant bit and the top bit is the least significant bit. Thus, the codeword for state 0 is 1111, the code word for state 1 is 1110 and so forth. An LLR is associated with each bit as indicated in FIG. 9b.

FIG. 9b depicts a table which provides initial values of LLRs for each bit of a code word based on a first read result. The LLRs are denoted by values M1, M2 and M3, where M1<M2<M3. As mentioned previously, a positive LLR indicates a 0 bit, a negative LLR indicates a 1 bit, and a greater magnitude indicates a greater reliability or probability of correctness. For example, for the lower bits in states 0 through 5, the LLR=−M3, indicating these bits have a high probability of being a 1. This can be seen intuitively, since the probability that the read state Y1 is far away from the programmed state, e.g., several states away, is small. Thus, the LLR for the lower bit for state M1 is −M3 (higher probability of correctness) since the read state would have to be off by three states from the programmed state, e.g., state 8 (where the lower bit is 0, not 1). However, the LLR for the lower bit for state 6 is −M2 (intermediate probability of correctness) since the read state would have to be off by two states for the bit to be errored. Similarly, the LLR for the lower bit for state 7 is −M1 (lower probability of correctness) since the read state would have to be off by only one state for the bit to be errored. Similar reasoning applies to the other bit positions. For example, the LLRs for the top bits indicate a relatively low probability of correctness since an error of only one state would result in the bit being incorrect.

FIG. 9c depicts a table which provides adjustments to current values of LLRs used by a decoder for each bit of a code word based on a second read result. When a second or other additional read operation is performed, the LLR values can be adjusted. In one possible approach, adjustments are made to the LLR values which are currently used by the decoder after having started decoding a first read result. As explained further in connection, e.g., with FIGS. 12 and 13, iterative probabilistic decoding involves applying parity checks of an error correction code to the read codeword. If a parity check fails, the decoder adjusts the LLR values in a direction toward satisfying the parity check. This process can be repeated in successive iterations. Sometimes the adjustments end up in an incorrect bit being flipped and the parity check being satisfied. In this case, the next parity check is performed, if applicable. An adjustment can thus be made to the current (most recently used) values of the LLRs while decoding is taking place.

Generally, if the second read value is consistent with the first read value, on a per bit basis, the current LLR can be increased in magnitude to indicate that the bit has a greater reliability. For example, if the first read is Y1=state 7 (code word 1011) and the second read is Y2=state 6 (code word 1010) the LLR can be adjusted for the top bit to indicate a greater probability that the bit is 1. Note that the initial LLR for the bit was −M1 based on the first read (FIG. 9b), but the decoding process may have changed this value to another negative or even positive value. The adjustment is applied to the current value, in this implementation. For example, the LLR may currently be −M2 in which is case it might be adjusted to a negative value greater in magnitude than M2. Or, the LLR may currently be +4 in which is case it might be adjusted to +1.

Note that the adjustment can be expressed in different ways, e.g., by a constant added or subtracted, or by a function. A table need not be used. For example, the adjustment can be made based on the magnitude of the LLR. It may not be necessary to adjust an LLR with a higher magnitude, or a relatively smaller adjustment may be made in such as case. Conversely, a relatively larger adjustment may be made when the LLR has a smaller magnitude. Generally, the adjustment can be based on factors such as how close the decoding process is to converging (e.g., based on the number of iterations and/or number of parity checks satisfied), the present values of the LLRs and/or the second or other additional read state. Testing of different adjustments can also be performed to determine satisfactory adjustments. The specific adjustments used can be tailored to the specific memory device implementation.

FIG. 10a-d depict tables which provide initial values of LLRs for each bit of a code word based on first and second read results. In one approach, the initial values of the LLRs which are used in the decoding process can be set based on the results of multiple read operations. A separate table can be provided for each bit position of the code words. For example, FIGS. 10a, 10b, 10 and 10d provide LLR values for a top bit, higher bit, upper bit and lower bit, respectively. Each table can be based on two read results Y1 and Y2, for instance. After reading each table, an initial LLR for each bit is provided to the decoding process. Note that the tables can have three or more dimensions if three or more read operations are used.

Figure 11A:
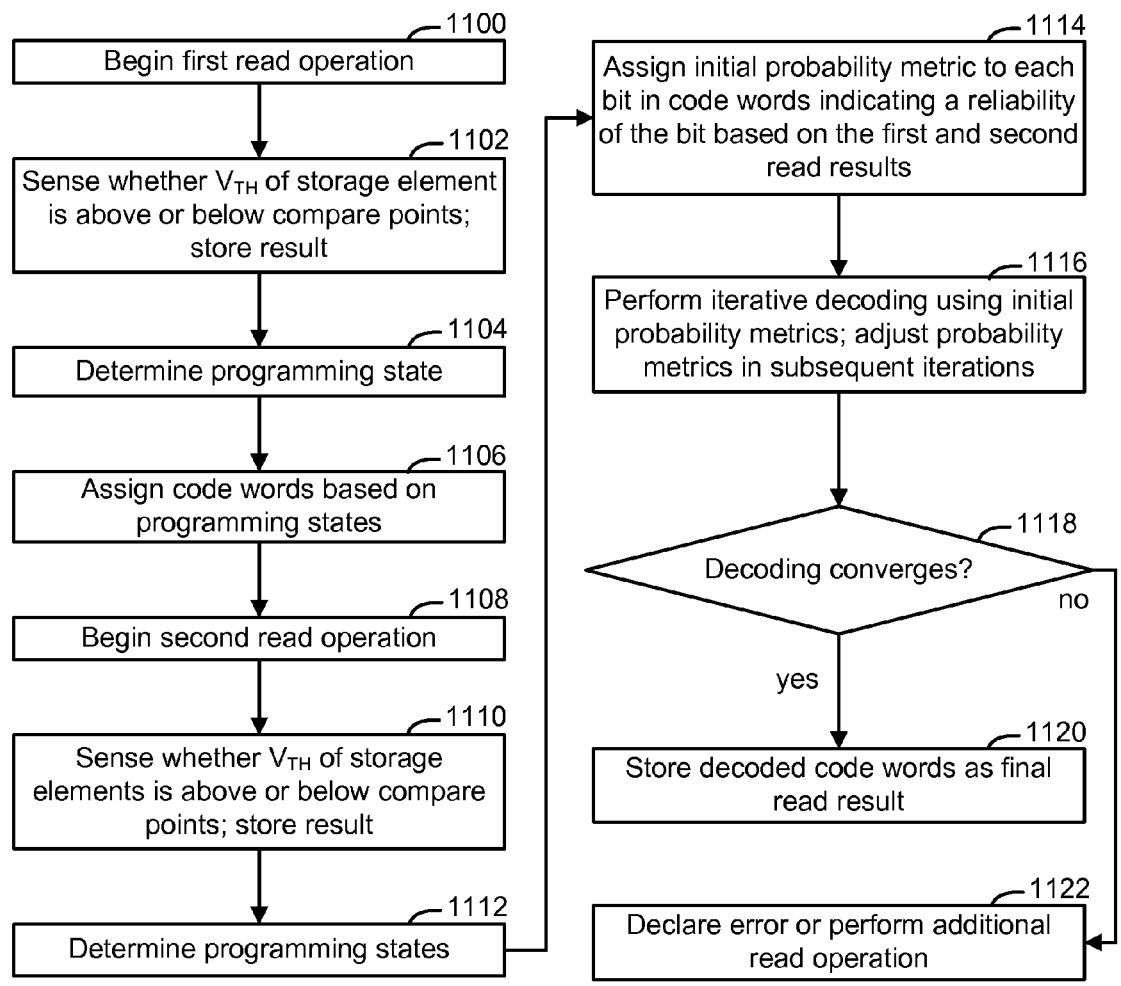
FIG. 11a is a flowchart of a process for decoding a code word which represents a state of a non-volatile storage element, where initial probability metrics are obtained based on first and second read operations.

FIG. 11a is a flowchart of a process for decoding a code word which represents a state of a non-volatile storage element, where initial probability metrics are obtained based on first and second read operations. Step 1100 includes beginning a first read operation. A read operation can include sensing whether the $V_{TH}$ of a storage element is above or below a number of compare points (step 1102). Some of the comparison points can result in hard bits, e.g., for comparison points that separate $V_{TH}$ ranges of programming states, and some of the comparison points can result in soft bits, e.g., for comparison points that bisect a $V_{TH}$ range of a programming state. In one approach, the read operation can use a first set of compare points followed by a second set of compare points which bisect the first set.

Each compare point determination can be considered to be a sense operation as can the read operation as a whole. In practice, a number of storage elements may be read during the read operation. For example, the error correction coding may be applied over a number of storage elements, in which case read results are obtained from those storage elements for use in the decoding. Based on the sensing, the programming states of the storage elements are determined (step 1104) and code words are assigned based on the programming states (step 1106). For example, the code words or bit assignments of FIG. 9a may be used when there are sixteen states. A second read operation begins at step 1108 such as by again sensing whether the $V_{TH}$ of a storage element is above or below the compare points (step 1110). Based on the sensing, the programming states of the storage elements are again determined (step 1112).

Step 1114 includes assigning initial probability metrics to each bit in the code words, where the metrics indicate a reliability of the bit based on the first and second read results. For example, this step can involve reading the tables of FIGS. 10a-10d to obtain LLRs, although other probabilistic metrics can be used as well. Step 1116 includes performing iterative decoding using the initial probability metrics, and adjusting the probability metrics in successive iterations. After the iterations of step 1116, if the decoding converges, e.g., all parity checks of the error correction code are satisfied, at decision step 1118, the decoded code words are stored as the final read result (step 1120). Note that the code words which are associated with the error correction process can be decoded at the same time when the parity checks extend over the code words. Alternatively, it is possible for a single code word to be decoded by itself when one or more parity checks involve only that code word. If the decoding does not converge, an error is declared or an additional read operation can be performed, for instance, at step 1122.

Figure 11B:
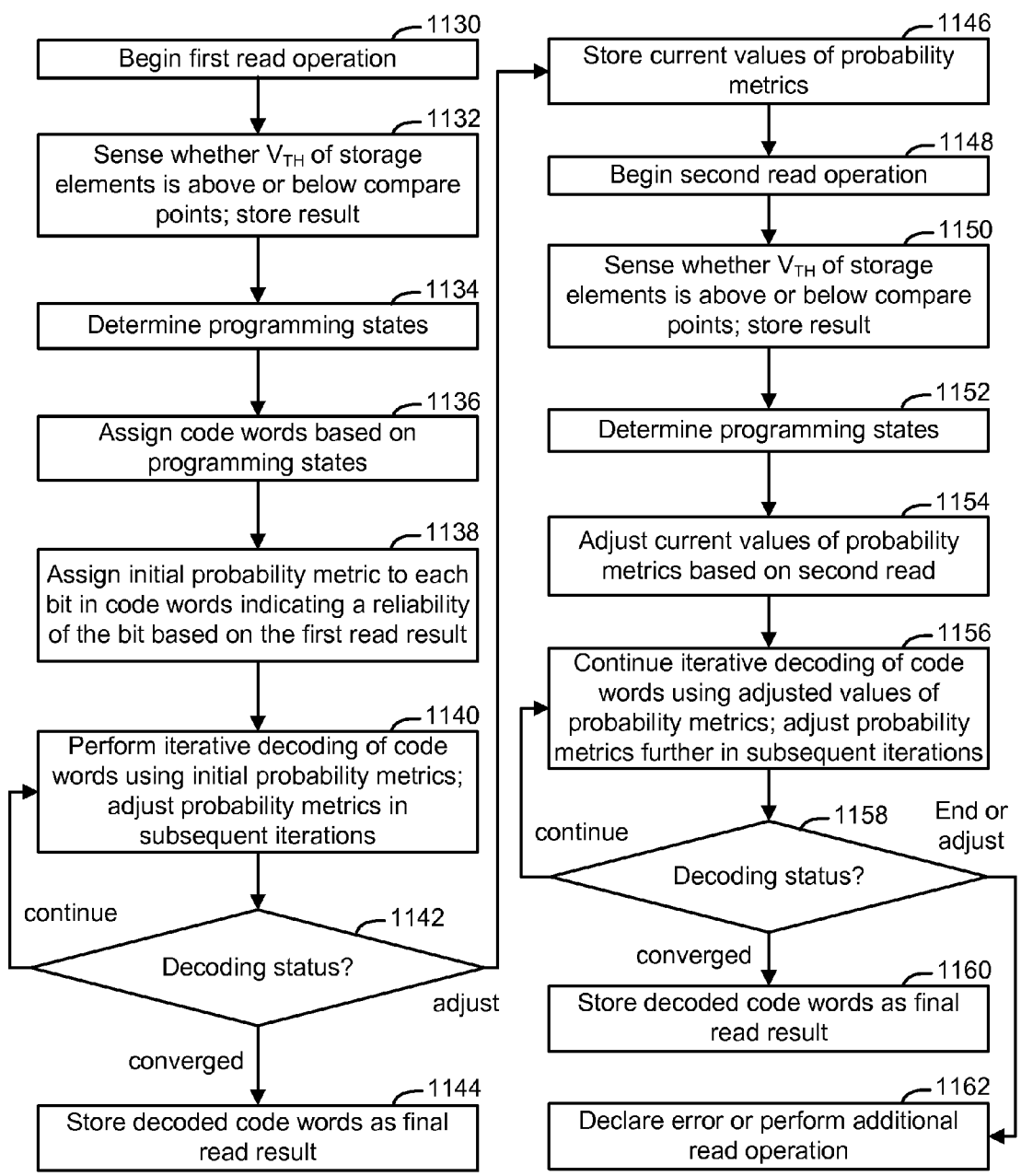
FIG. 11b is a flowchart of a process for decoding a code word which represents a state of a non-volatile storage element, where initial probability metrics are obtained based on a first read operation, then adjusted probability metrics are adjusted further based on a second read operation.

FIG. 11*b* is a flowchart of a process for decoding a code word which represents a state of a non-volatile storage element, where initial probability metrics are obtained based on a first read operation, then adjusted probability metrics are adjusted further based on a second read operation. As discussed, in one implementation, the decoding process can be temporarily paused so that the current LLR values, which are adjusted relative to the initial LLR values, are adjusted further based on one or more additional read results. Steps 1130, 1132, 1134 and 1136 correspond to steps 1100, 1102, 1104 and 1106, respectively, of FIG. 11*a*. Step 1138 includes assigning initial probability metrics to each bit in the code words, where the metrics indicate a reliability of the bit based on the first read results. For example, this step can involve reading the table of FIG. 9*b* to obtain LLRs, although other probabilistic metrics can be used as well. Step 1140 includes performing iterative decoding using the initial probability metrics, and adjusting the probability metrics in successive iterations. If the decoding converges within a given time period, e.g., elapsed time, and/or a given number of iterations, at decision step 1142, the decoded code words are stored as the final read result (step 1144). If the decoding progresses toward converging, such as by satisfying a specified number of parity checks, the decoding continues. Appropriate software, hardware and/or firmware can be provided in the decoder to enforce this provision.

If the decoding does not converge or progress toward convergence, the decoding is adjusted. The current values of the probability metrics are stored at step 1146, and a second read operation is begun at step 1148. Steps 1150 and 1152 correspond to steps 1132 and 1134, respectively. Step 1154 includes adjusting the current values of the probability metrics based on the second read. For example, this can include applying the LLR adjustments depicted by the table of FIG. 9*c*. At step 1156, the iterative decoding continues using the adjusted values of the probability metrics, which can be adjusted further in subsequent iterations. The decoding process is improved due to the information provided by the second read. For example, the decoding process may converge sooner than if only results from a single read were used, or the decoding process may converge where the singe read case would not converge. At decision step 1158, the decoding status is again checked, similar to the check of decision step 1142. If the decoding converges within a given time period, e.g., elapsed time, and/or a given number of iterations, at decision step 1158, the decoded code words are stored as the final read result (step 1160). Note that the metric for progression toward converging in step 1158 can be more lax than at step 1142. If the decoding progresses toward converging, such as by satisfying a specified number of parity checks, the decoding continues. If the decoding does not meet the second condition, an error can be declared or an additional read operation can be performed (step 1162), and the results of that read operation used to adjust the decoding process again.

Note that, instead of beginning an additional read operation in response to the decoding not meeting a certain condition, it is possible to perform the additional read operation automatically after the decoding process has started based on the first read operation. In this case, the decoding process can be paused to update the LLRs when the second read operation has been completed, regardless of whether the decoding meets a certain condition, or the results of the second operation can be stored for subsequent use in the decoding process, if necessary.

Figure 11C:
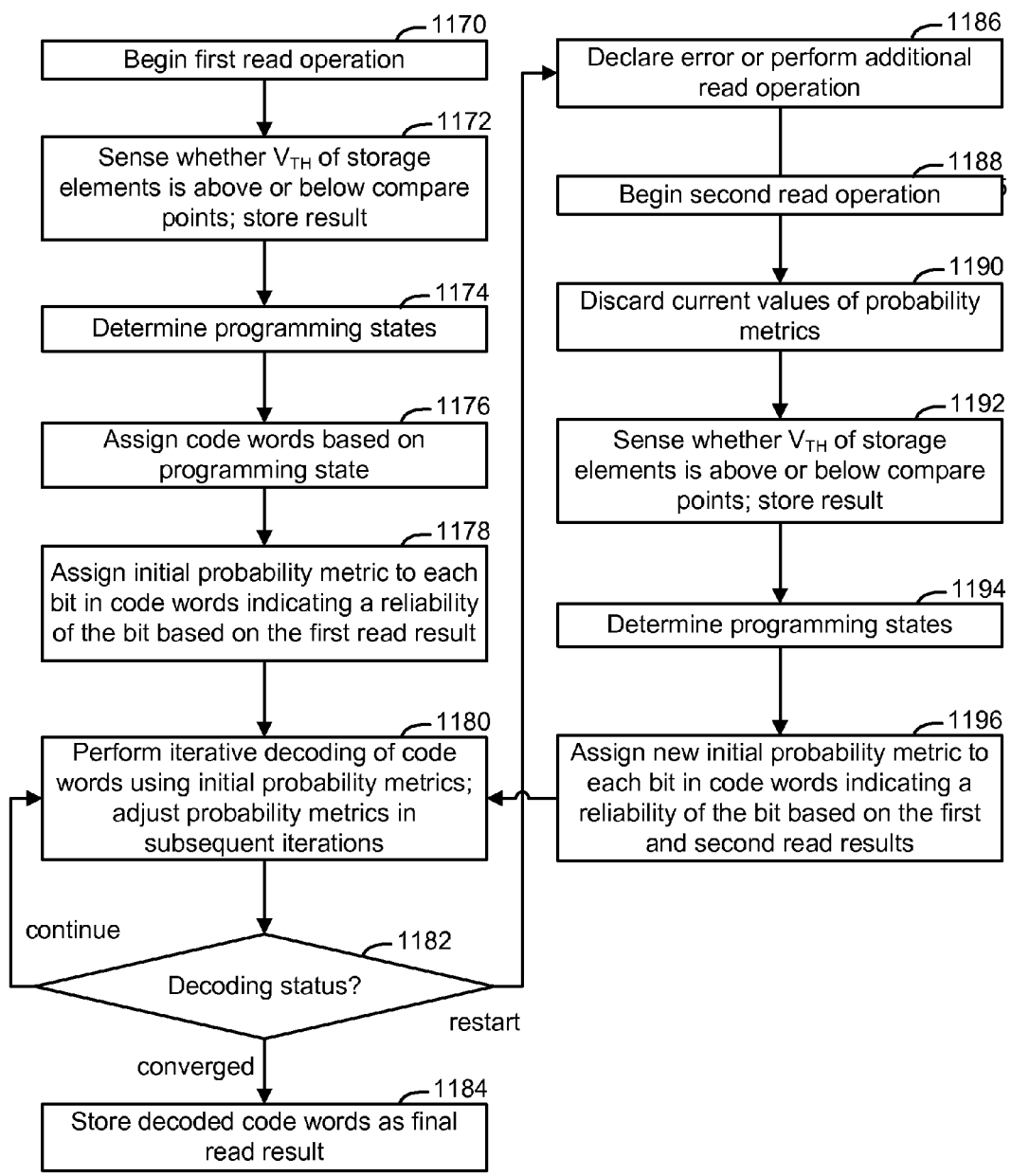
FIG. 11c is a flowchart of a process for decoding a code word which represents a state of a non-volatile storage element, where initial probability metrics are obtained based on a first read operation, then new initial probability metrics are obtained based on the first read operation and a second read operation.

FIG. 11*c* is a flowchart of a process for decoding a code word which represents a state of a non-volatile storage element, where initial probability metrics are obtained based on a first read operation, then new initial probability metrics are obtained based on the first read operation and a second read operation. In this approach, the decoding is essentially restarted from the beginning when it does not meet a certain condition based on initial LLRs obtained from a first read. However, the new initial LLRs are based on both the first and second read operations, or other additional read operations. Steps 1170, 1172, 1174, 1176, 1178, 1180, 1182 and 1184 correspond to steps 1130, 1132, 1134, 1136, 1138, 1140, 1142 and 1144, respectively, of FIG. 11*b*. At step 1186, when the decoding does not meet the first condition at decision step 1182, an error can be declared or an additional read can be performed. If a second read operation is to be used (step 1188), the current values of the probability metrics, e.g., LLRs, which are used by the decoder are discarded at step 1190. Steps 1192 and 1194 correspond to steps 1150 and 1152, respectively, of FIG. 11*b*. At step 1196, new initial probability metrics are assigned to each bit in the code words, e.g., the code words assigned in step 1176. These new probability metrics indicate the reliability of the bits based on the first and second read operations.

Figures 12, 13:
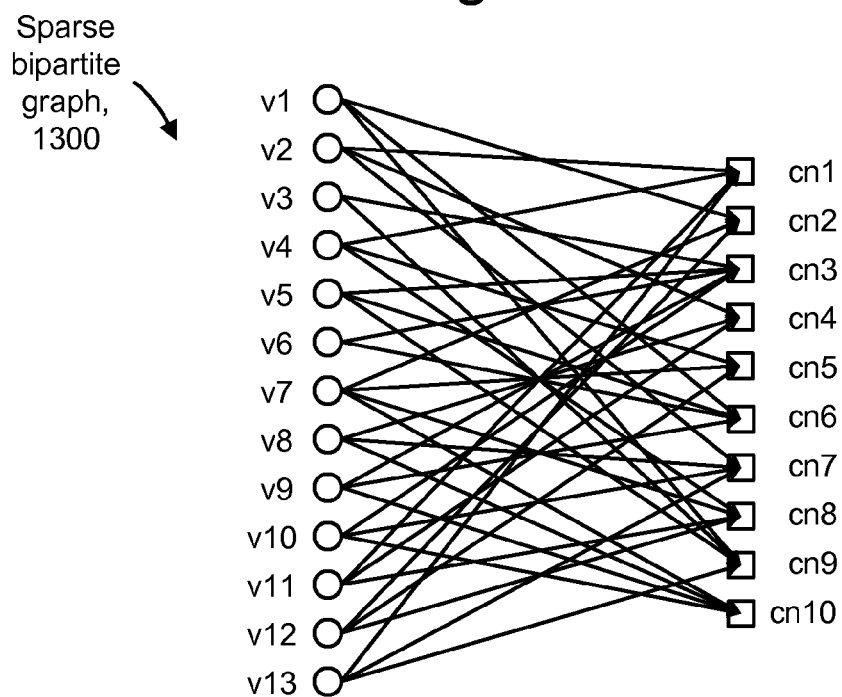
FIG. 12 depicts a sparse parity check matrix.
FIG. 13 depicts a sparse bipartite graph which corresponds to the sparse parity check matrix of FIG. 12.

FIG. 12 depicts a sparse parity check matrix. As mentioned previously, the storage elements store data which represents information bits and parity bits, where the parity bits are provided according to an error correction coding process. Such a process involves adding parity bits to information bits. In one possible approach, a low density parity check (LDPC) code is used. In practice, such codes are typically applied to multiple code words which are encoded across a number of storage elements. LDPC codes are desirable because they incur a relatively low overhead cost. Moreover, LDPC codes exhibit a performance near the Shannon limit under iterative message-passing decoding algorithms. However, this is an example implementation only, as any type of error correction code can be used. For example, other linear block codes may be used.

An LDPC code is a linear block code which is characterized by a sparse parity check matrix, e.g., as depicted by the matrix H 1200. The matrix includes K information bits and M parity bits, and the code length is N=K+M. Further, the parity bits are defined such that M parity check equations are satisfied, where each row of the matrix represents a parity check equation. In particular, the rows of the matrix are identified by check nodes cn1 through cn10 and the columns are identified by variables v1 through v13, which indicate the data that is stored in the storage elements, e.g., the code word bits. This data includes information bits i and parity bits p, based on the equation:

$$H \cdot \overline{v} = H \cdot \begin{bmatrix} \overline{i} \\ \overline{p} \end{bmatrix} = 0,$$

where H is the sparse parity check matrix, $\overline{v}$ is the data matrix, $\overline{i}$ is the information bit matrix and p is the parity bit matrix.

The information bits can be taken from different bit positions of different code words, in one approach. The data matrix v can be determined by solving the above equation. Further, this can be done efficiently using a Gaussian elimination procedure if the matrix H is lower triangular.

FIG. 13 depicts a sparse bipartite graph which corresponds to the sparse parity check matrix of FIG. 12. The graph 1300 indicates in further detail how the LDPC code works. The variable nodes v1 through v13 represent the code word bits and the check nodes cn1 through cn10 represent the parity check constraints on the bits.

During decoding, the decoder attempts to satisfy the parity checks. In this example, there are ten parity checks as indicated by the check nodes cn1 through cn10. The first parity check at cn1 determines if v2$\otimes$v4$\otimes$v11$\otimes$v13=0, where $\otimes$ denotes the exclusive-or (XOR) logical operation. This check is satisfied if there is an even number of "1" bits in v2, v4, v11 and v13. This check is denoted by the fact that arrows from nodes v2, v4, v11 and v13 point to node cn1 in the graph 1300. The second parity check at cn2 determines if v1$\otimes$v7$\otimes$v12=0, which is satisfied if there is an odd number of "1" bits. The third parity check at cn3 determines if v3$\otimes$v5$\otimes$v6$\otimes$v9®v10=0, which is satisfied if there is an odd number of "1" bits. Similarly, the fourth parity check at cn4 determines if v2$\otimes$v8$\otimes$v11=0, the fifth parity check at cn5 determines if v4$\otimes$v7$\otimes$v12=0, the sixth parity check at cn6 determines if v1$\otimes$v5$\otimes$v6$\otimes$v9=0, the seventh parity check at cn7 determines if v2$\otimes$v8$\otimes$v10$\otimes$v13=0, the eighth parity check at cn8 determines if v4$\otimes$v7$\otimes$v11$\otimes$v12=0, the ninth parity check at cn9 determines if v1$\otimes$v3$\otimes$v5$\otimes$v13$\otimes$=0 and the tenth parity check at cn01 determines if v7$\otimes$v8$\otimes$v9$\otimes$v10=0.

The decoding process for LDPC is an iterative probabilistic decoding process known as iterative message passing decoding. The iterating involves serially traversing the check nodes and updating the LLR values of the bits involved based on each parity check. In one approach, an attempt is made to satisfy the first parity check of cn1. Once that parity check is satisfied, an attempt is made to satisfy the first parity check of cn2 and so forth. The LLR values are adjusted, if necessary, for each iteration in a manner known to those skilled in the art. This iterative algorithm is a form of belief propagation.

Use of Pre-Conditioning Waveforms

The sensed programming state of a storage element can vary over different read operations based on the history of the storage element. For example, the state of a storage element will sometimes change between two read operations, and the number of storage elements changing their states can depend on the history of the control gate voltages. The tendency for a read state to change is based on a variety of factors including the $V_{TH}$ width for each state, the spacing between states, trap site noise and other factors.

It can be useful, therefore, to intentionally create different short terms histories when two or more sensing operations are performed. In one approach, the different short terms histories are used at the same voltage level, or at neighboring voltage levels. For example, just prior to a first read operation, the selected word line can be grounded. To make a second read operation's short term history different, we can apply a pre-conditioning waveform in the form of a read pass voltage, e.g., $V_{READ}$=5.5 V, for instance, to the selected word line just before the onset of the second read operation. $V_{READ}$ is the voltage which is typically applied to unselected word lines when storage elements on a selected word line are being read. However, this is one example among many possible implementations. For example, the amplitude, duration and shape, in addition to the time interval between the end of the pre-conditioning waveform and the onset of the integration time of sensing, are all parameters that can be optimized, e.g., with the RC time constants of the word lines and other lines in mind.

To the extent that the $V_{TH}$ of some noisy storage elements depends on the short term history of the biases applied to their various terminals, such as the control gate and the C-P-well, the differing short term histories should increase the noisy behavior, and this increase will help us identify more suspect bits. This additional information should improve the iterative decoding process by identifying noisy storage elements and acknowledging the uncertainty about the value of certain bits. This acknowledgment of ignorance can be used to help focus the attention of the decoding process on the more troublesome bits where more attention is needed. In short, it is better to know that we do not know the value of some bits than to pretend that we do.

Figure 24:
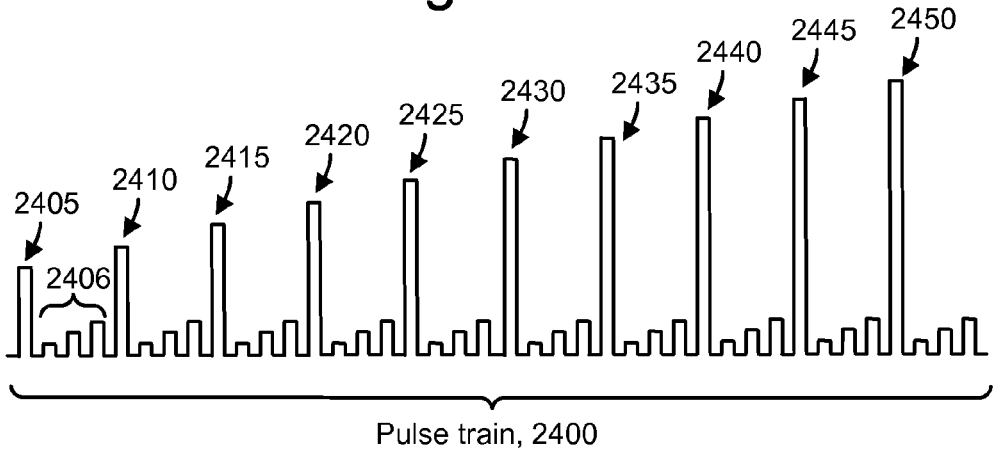
FIG. 24 depicts an example pulse train applied to the control gates of non-volatile storage elements during programming.

The use of a pre-conditioning waveform prior to the sense operation allows the history of the read operation to more closely resemble the history of the verify operation performed during programming, as the short term history of the verify operation included a program ($V_{PGM}$) pulse. Example $V_{PGM}$ pulses, whose amplitude varies between, e.g., 13-20 V, are depicted in FIG. 24. The amplitude of the pre-conditioning waveform need not be as high as the amplitude of the program pulse, but it can still duplicate the short term history that a storage element undergoes when a verify operating is performed as part of the programming operation. Thus, the effect that a program pulse has on a storage element prior to a verify operation is replicated in part by the effect that a pre-conditioning pulse has on a storage element prior to a read operation. For implementations where additional read operations are performed only when necessary, e.g., when the decoding process based on one read operation is not converging, the first read can use the pre-conditioning waveform prior to the sense operation, in one possible approach.

Further, the probability metrics, such as LLRs, which are used in the decoding process can account for the effects of pre-conditioning waveforms. Thus, the initial LLR assigned to a bit can vary based on the history of the associated storage element. For example, if the same bit value in a codeword is obtained from read operations with and without pre-conditioning waveforms, the magnitude of the LLR for the bit should be higher to indicate a more confident measure of the bit's value than if the bit value was obtained from read operations both without pre-conditioning waveforms, or even both with pre-conditioning waveforms.

In particular, the pre-conditioning waveforms can affect the probability distribution functions (pdfs) of the various programming states. This effect is measurable by comparing the pdf of the $V_{TH}$ distribution of a set of storage elements with and without pre-conditioning waveforms. Generally, with the use of pre-conditioning waveforms, a mathematical method for aggregating the LLR results from multiple reads can be provided based on the behavior of the storage elements for a particular technology. For example, if every one of the reads yields the same result, then we can assign a high-magnitude LLR for the bits of the code word which represent the state. This peak LLR (LLRpeak) would be higher than the LLR that is used for only a single read (LLRsingle). On the other hand, if the series of reads yields differing results, then a lower final LLR would result. One method of aggregating a series of reads is to take the average of the single-read LLRs, and then multiplying the average by a normalization factor such as LLRpeak/LLRsingle.

Examples below depict one or more pre-conditioning pulses occurring before the sensing operations of a read operation, but, in general, any pre-conditioning waveform can be used. Further, a pre-conditioning waveform can be applied to a terminal of a storage element, e.g., control gate, source and/or drain, and/or to a substrate on which the storage element is formed. For instance, a first pre-conditioning waveform can be applied to a non-volatile storage element via a body of a substrate on which the non-volatile storage element is formed, and a second pre-conditioning waveform can be applied to a control gate, a source and a drain of the storage element. Or, the second pre-conditioning waveform can be applied to a non-volatile storage element via the body, and the first pre-conditioning waveform applied to the control gate, source and/or the drain of the storage element. Further, pre-conditioning waveforms with different characteristics can be applied during one read operation or during different read operations.

Moreover, the pre-conditioning waveform can be used in a single read approach as well as a multiple read approach. Further, the pre-conditioning waveform can be used with any type of error correction decoding, or without error correction decoding.

FIG. 14a is a timing diagram that explains the behavior of certain waveforms during read/verify operations, where a pre-conditioning waveform is applied to a selected word line before an associated read pulse. The waveforms in this and the other timing diagrams are not necessarily to scale.

As mentioned, a pre-conditioning waveform can be applied to a storage element as part of the read operation. This can involve applying a pre-conditioning waveform such as a pulse to the control gates of the storage elements being read via the associated selected word line, for instance, prior to applying a sensing voltage to the word line for comparing the $V_{TH}$ of the storage elements to a compare point. Moreover, a preconditioning waveform can be applied just prior to any read or just prior to some of the read operations. It can be combined with various levels of soft reads. It can also be combined with the multiple reads at the same voltage level.

In general, during read and verify operations, the selected word line or other control line is connected to a voltage, a level of which is specified for each read and verify operation, in order to determine whether a threshold voltage of the concerned storage element has reached such level. After applying the word line voltage, the conduction current of the storage element is measured to determine whether the storage element turned on. If the conduction current is measured to be greater than a certain value, then it is assumed that the storage element turned on and the voltage applied to the word line is greater than the threshold voltage of the storage element. If the conduction current is not measured to be greater than the certain value, then it is assumed that the storage element did not turn on and the voltage applied to the word line is not greater than the threshold voltage of the storage element.

There are many ways to measure the conduction current of a storage element during a read or verify operation. In one example, the conduction current of a storage element is measured by the rate it allows (or fails to allow) the NAND string that included the storage element to discharge the bit line. The charge on the bit line is measured after a period of time to see whether it has been discharged or not. In another embodiment, the conduction of the selected storage element allows current to flow or not flow on a bit line, which is measured by whether a capacitor in the sense amplifier is charged due to the flow of current. Both examples are discussed.

In particular, waveform 1400 depicts a drain side select gate voltage (SGD), waveform 1402 depicts an unselected word line voltage, waveform 1404 depicts a selected word line voltage (of the word line selected for reading/verification), waveform 1410 depicts a source side select gate (SGS) voltage (option 1), waveform 1412 depicts a SGS voltage (option 2), waveform 1414 depicts a selected bit line (BL) voltage (option 1) (of the bit line selected for reading/verification), waveform 1418 depicts a selected BL voltage (option 2) and waveform 1419 depicts a source voltage. Additionally, time points t0-t4 extend in the horizontal direction.

Note that there are two versions of SGS and Selected BL depicted. Option depicts a read/verify operation for an array of storage elements that measure the conduction current of a storage element by determining whether the bit line has discharged. Option 2 depicts a read/verify operation for an array of storage elements that measure the conduction current of a storage element by the rate it discharges a dedicated capacitor in the sense amplifier.

First, the behavior of the sensing circuits and the array of storage elements that are involved in measuring the conduction current of a storage element by determining whether the bit line has discharged will be discussed with respect to option 1.

Prior to t0, the voltages start at a steady state voltage, Vss, of approximately 0 V. Between t0 and t1, a pre-conditioning waveform 1406 is applied to the selected word line prior to the read pulse 1408. Note that, in another approach, the pre-conditioning waveform or waveforms can overlap with the sense operation (read pulse 1408). At t2, SGD and SGS (option 2) are raised to $V_{SGD}$ and $V_{SGS}$, respectively (e.g., 3.5 V). The unselected word lines are raised to $V_{READ}$ (e.g., 6 V), which acts as an overdrive voltage because it causes the unselected storage elements to turn on and act as pass gates. The pre-conditioning waveform 1406 can have an amplitude comparable to $V_{READ}$, for instance, which is greater than $V_{CGR}$. $V_{READ}$ is generally the highest voltage which can be applied without causing disturbs. The selected word line is raised to $V_{CGR}$ (control gate read voltage) for a read operation or to a verify level for a verify operation. The waveform on the selected word line between t2 and t4 is considered to be a read pulse 1408 which is used during a sense operation. The selected BL (option 1) is pre-charged to approximately 0.7 V, in one approach.

The process depicted in FIG. 14a can then be repeated at the next read or verify level, in which a different $V_{CGR}$ is applied to sense whether the $V_{TH}$ of the storage elements associated with the selected word line is above or below a corresponding compare point. In one approach, the pre-condition pulse is provided before each sense operation.

At t3, the NAND string can control the bit line. Also at t3, the source side select gate is turned on by raising SGS (option 1) to $V_{SGS}$. This provides a path to dissipate the charge on the bit line. If the $V_{TH}$ of the storage element selected for reading is greater than $V_{CGR}$ or the verify level applied to the selected word line, then the selected storage element will not turn on and the bit line will not discharge, as depicted by line 1415. If the threshold voltage in the storage element selected for reading is below $V_{CGR}$ or below the verify level applied to the selected word line, then the storage element selected for reading will turn on (conduct) and the bit line voltage will dissipate, as depicted by curve 1416. At some point after time t3 and prior to time t4 (as determined by the particular implementation), the sense amplifier will determine whether the bit line has dissipated a sufficient amount. In between t3 and t4, the sense amplifier measures the evaluated BL voltage. At time t4, the depicted waveforms will be lowered to Vss (or another value for standby or recovery).

Discussed next, with respect to option 2, is the behavior of the sensing circuits and the array of storage elements that measure the conduction current of a storage element by the rate at which it charges a dedicated capacitor in the sense amplifier. The pre-conditioning waveform 1406 is applied between t0 and t1 as before. At time t2, SGD is raised to $V_{SGD}$, the unselected word lines are raised to $V_{READ}$, and the selected word line is raised to $V_{CGR}$ for a read operation or to a verify level for a verify operation. In this case, the sense amplifier holds the bit line voltage constant regardless of what the NAND sting is doing, so the sense amplifier measures the current flowing with the bit line "clamped" to that voltage. At some point after t2 and prior to t4 (as determined by the particular implementation), the sense amplifier will determine whether the capacitor in the sense amplifier has dissipated a sufficient amount. At t4, the depicted waveforms will be lowered to Vss (or another value for standby or recovery). Note that in other embodiments, the timing of some of the waveforms can be changed.

Figure 14B:
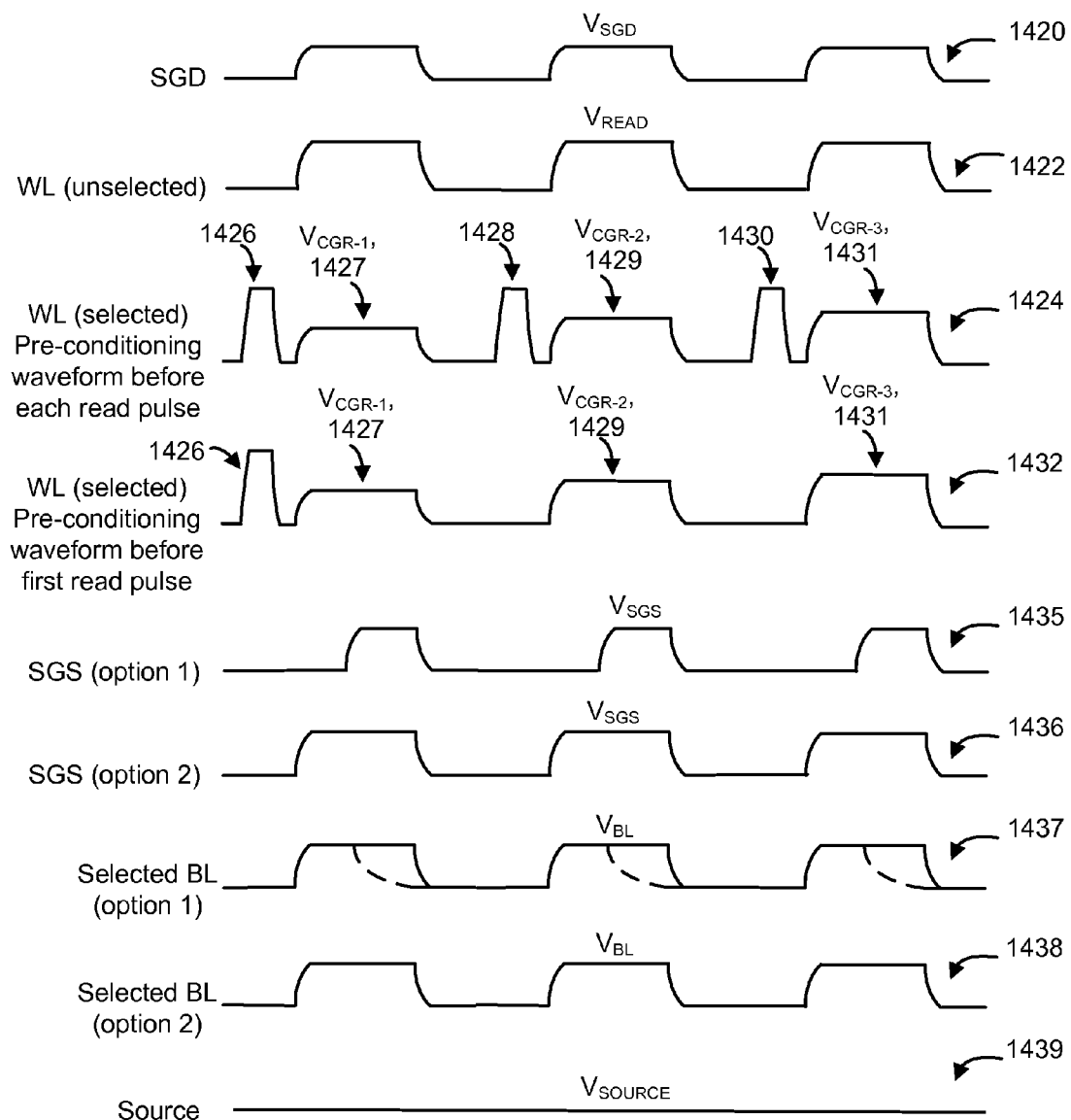
FIG. 14b is a timing diagram that explains the behavior of certain waveforms during read/verify operations, where one or more pre-conditioning waveforms are applied to a selected word line before associated read pulses.

FIG. 14b is a timing diagram that explains the behavior of certain waveforms during read/verify operations, where one or more pre-conditioning waveforms are applied to a selected word line before associated read pulses. Here, three sense operations which make up part of a read operation are depicted. For example, with sixteen states, there would be fifteen sense operations. Waveforms 1420, 1422, 1424, 1435, 1436, 1437, 1438 and 1439 represent the waveforms 1400, 1402, 1404, 1410, 1412, 1414, 1418 and 1419, respectively, of FIG. 14a over three sense operations. Waveform 1432 is analogous to waveform 1424 but includes the pre-conditioning waveform 1426 only before the first read pulse 1427 in the series of read pulses which make up a read operation. In waveform 1424, pre-conditioning waveforms 1426, 1428 and 1430 are applied to the selected word line prior to read pulses 1427, 1429 and 1431, respectively, which are associated with different $V_{TH}$ compare points. The read pulse amplitude increases in each sense operation, e.g., from $V_{CGR-1}$ to $V_{CGR-2}$ to $V_{CGR-3}$ and so forth. The amplitude of the pre-conditioning waveforms can be the same for each sense operation or can vary, e.g., with the amplitude of the associated read pulse. Regarding waveform 1432, note that, generally, the pre-conditioning waveform can be provided before one or more selected read pulses in a read operation. Moreover, the read pulses which have associated pre-conditioning waveforms can be selected randomly.

Figure 14C:
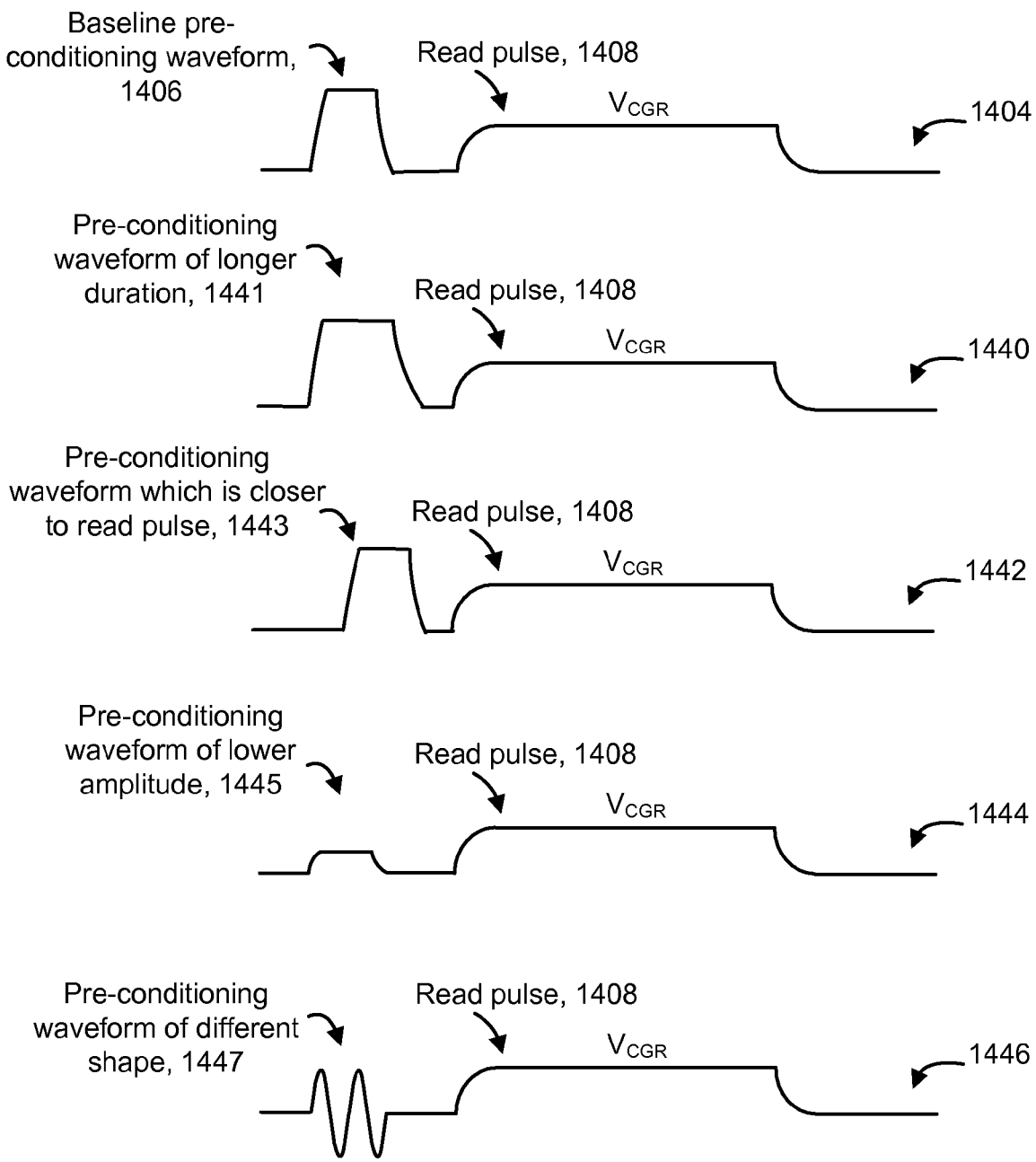
FIG. 14c is a timing diagram that depicts different pre-conditioning waveforms.

FIG. 14c is a timing diagram that depicts different pre-conditioning waveforms. As mentioned, the pre-conditioning waveform can have a variety of characteristics. Waveform 1404 (discussed also in FIG. 14a) includes a baseline pre-conditioning waveform 1406 as a pulse which is provided before a read pulse 1408. Note that the waveform 1406 and the pulse 1408 show a rise time and a decay time which will vary for different memory devices. In one option, waveform 1440 includes a pre-conditioning waveform 1441 as a pulse with a longer duration compared to pulse 1406. Waveform 1442 includes a pre-conditioning waveform 1443 which is closer to the read pulse 1408 compared to pulse 1406. The time period at issue extends from the end of the pre-conditioning waveform to the start of the read pulse. Waveform 1444 includes a pre-conditioning waveform 1445 as a pulse with a lower amplitude, compared to pulse 1406. Waveform 1446 includes a pre-conditioning waveform 1447 with a different shape, compared to pulse 1406. Here, an oscillating waveform is used. While this waveform does not replicate a programming pulse, and even includes negative voltages, it can still provide useful, e.g., in causing trap site activity. Other waveforms including ramps, steps and so forth can also be used. It is also possible to provide multiple pre-conditioning waveforms before a read pulse.

FIG. 14d is a timing diagram that explains the behavior of certain waveforms during read/verify operations, where a pre-conditioning waveform is applied to a drain of a selected storage element via a selected bit line before an associated read pulse. Generally, instead of applying a voltage waveform to the control gate of the storage elements via the selected word line, a voltage waveform can be applied to any other terminal, such as a source or drain, or via a body bias. In this approach, the drain terminal is accessed via the bit line associated with a NAND chain. As depicted by waveform 1450, the drain side select gate is opened by raising $V_{SGD}$ between t0 and t1, at which time the pre-conditioning waveform 1456 or 1460 is applied (waveforms 1454 and 1458, respectively) to the bit line. The drain side select gate can be opened just before t0 until just after t1 to envelope the pre-conditioning waveform 1460. The read pulse 1408 occurs between t2 and t4, as discussed previously. The drain side select gate is also opened between t2 and t4 during the read pulse. Note that the drain side select gate can be kept open between t0 and t4 continuously as well.

FIG. 14e is a timing diagram that explains the behavior of certain waveforms during read/verify operations, where a pre-conditioning waveform is applied to a source of a selected storage element via a source line before an associated read pulse. In this approach, the source terminal is accessed via the source line associated with a NAND chain. As depicted by waveforms 1462 or 1464, the source side select gate is opened by raising $V_{SGS}$ between t0 and t1, at which time the pre-conditioning waveform 1468 in waveform 1466 is applied on the source line. The source side select gate can be opened just before t0 until just after t1 to envelope the pre-conditioning waveform 1468. The read pulse 1408 occurs between t2 and t4, as discussed previously. The source side select gate is also opened between t2 and t4 during the read pulse. Note that the source side select gate can be kept open between t0 and t4 continuously as well.

FIG. 14f is a timing diagram that explains the behavior of certain waveforms during read/verify operations, where a pre-conditioning waveform is applied to a selected storage element via a body bias before an associated read pulse. In this approach, the substrate which the storage elements are formed on is biased with a body bias voltage $V_B$. For example, a p-well of the substrate can be biased with $V_B<0$ to increase the control gate to body voltage. As depicted by waveform 1470, the pre-conditioning waveform 1472 can be applied to the body between t0 and t1. The read pulse 1408 occurs between t2 and t4, as discussed previously.

FIG. 14g is a flowchart of a process for performing a read operation on a storage element, where pre-conditioning waveforms are applied to a storage element before associated read pulses. The read operation begins at step 1474. An index k, representing a programmed state, is initialized to zero at step 1475. A pre-conditioning waveform is applied at step 1476 and a read pulse is applied at step 1477. Step 1478 includes sensing whether the $V_{TH}$ is above or below a read compare point. If there is a next compare point, at decision step 1479, the index is incremented at step 1480, and steps 1476-1478 are repeated. If there is no further compare point, the read operation has completed and the results are stored at step 1481.

FIG. 14h is a flowchart of a process for performing a read operation on a storage element, where a pre-conditioning waveform is applied to a storage element before a series of read pulses. The read operation begins at step 1482. An index k, representing a programmed state, is initialized to zero at step 1483. A pre-conditioning waveform is applied at step 1484 and a read pulse is applied at step 1485. Step 1486 includes sensing whether the $V_{TH}$ is above or below a read compare point. If there is a next compare point, at decision step 1487, the index is incremented at step 1488, and steps 1485 and 1486 are repeated. If there is no further compare point, the read operation has completed and the results are stored at step 1489. In this case, the pre-conditioning pulse is not used again for the read operation.

FIG. 14i is a flowchart of a process for obtaining reliability metrics using pre-conditioning waveforms for subsequent use in decoding. See also FIGS. 5a, 5b and 8. Step 1490 includes programming random data to storage elements, and step 1491 initializes an index k to state 0. State 1492 includes performing measurements of $V_{TH}$ for each storage element written to state k, sometimes with the pre-conditioning waveform and sometimes without, and/or with different waveform characteristics (e.g., amplitude, duration and timing). In this manner, electrons in the storage elements are influenced to enter and exit trap sites, for instance, to provide a more accurate $V_{TH}$ distribution. Step 1493 includes obtaining reliability metrics (e.g., LLRs) for state k based on the measurements and step 1494 includes storing the results. If there is a next state at decision step 1495, k is incremented at step 1496 and steps 1492 and 1493 are repeated. If there is no next state, the process ends at step 1497.

Thus, the pre-conditioning waveform can be used in a test environment when reliability metrics are being developed for a non-volatile storage and/or in a production environment when the non-volatile storage is being read. In one approach, tables similar to those discussed in connection with FIGS. 9b-10d can be developed with and without the use of pre-conditioning pulses, and/or with the use of different pre-conditioning pulses. These tables are then accessed during the production environment when the non-volatile storage is being read, as discussed previously.

Figure 15:
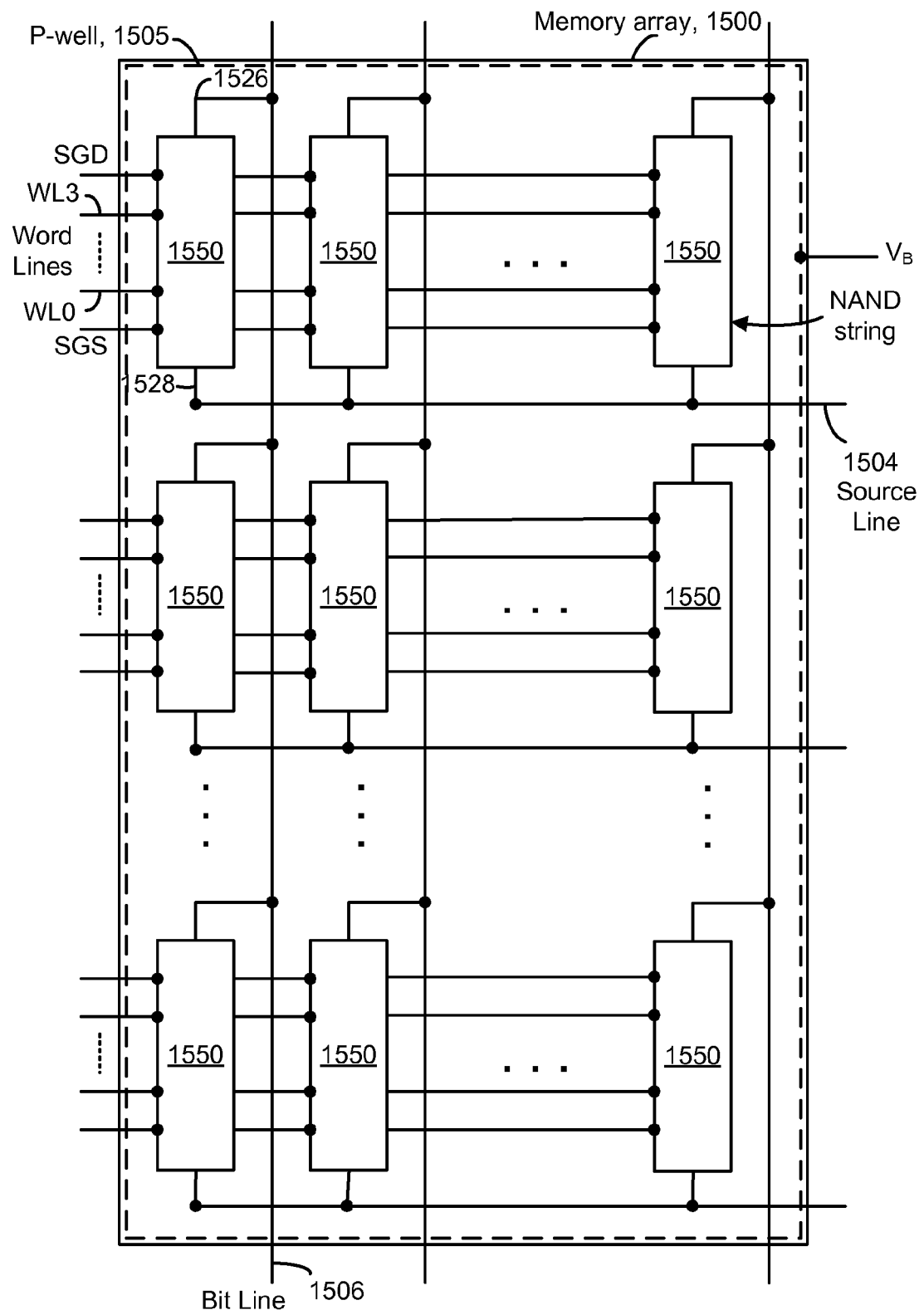
FIG. 15 is a block diagram of an array of NAND flash storage elements.

FIG. 15 illustrates an example of an array 1500 of NAND storage elements, such as those shown in FIGS. 1 and 2. Along each column, a bit line 1506 is coupled to the drain terminal 1526 of the drain select gate for the NAND string 1550. Along each row of NAND strings, a source line 1504 may connect all the source terminals 1528 of the source select gates of the NAND strings. The NAND strings and storage elements are formed on a p-well 1505 which can receive a body bias $V_B$ in some implementations. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array.

Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well 1505 on which the NAND strings and storage elements are formed to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 16:
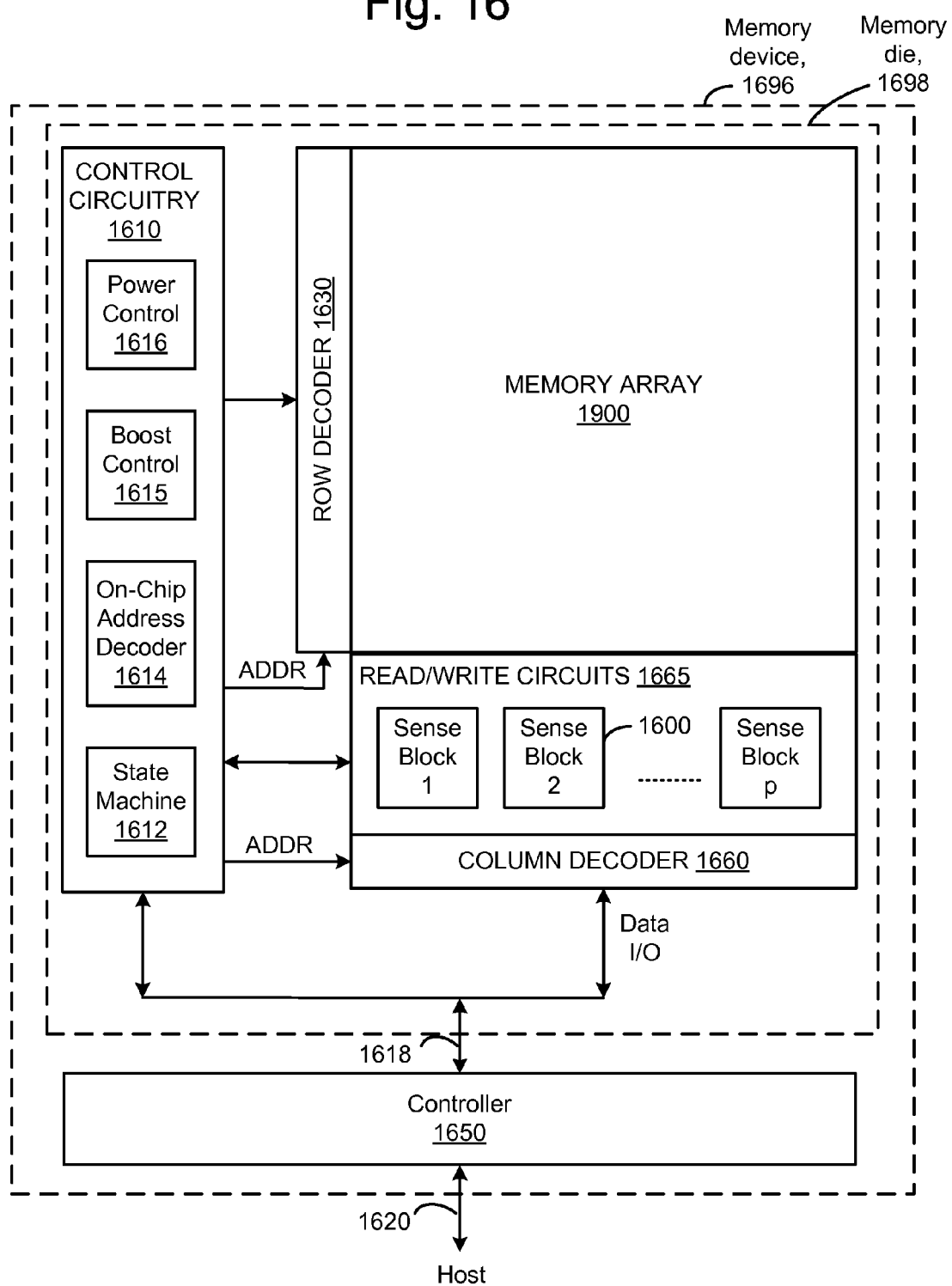
FIG. 16 is a block diagram of a non-volatile memory system using single row/column decoders and read/write circuits.

FIG. 16 is a block diagram of a non-volatile memory system using single row/column decoders and read/write circuits. The diagram illustrates a memory device 1696 having read/write circuits for reading and programming a page of storage elements in parallel, according to one embodiment of the present invention. Memory device 1696 may include one or more memory die 1698. Memory die 1698 includes a two-dimensional array of storage elements 1500, control circuitry 1610, and read/write circuits 1665. In some embodiments, the array of storage elements can be three dimensional. The memory array 1500 is addressable by word lines via a row decoder 1630 and by bit lines via a column decoder 1660. The read/write circuits 1665 include multiple sense blocks 1600 and allow a page of storage elements to be read or programmed in parallel. Typically a controller 1650 is included in the same memory device 1696 (e.g., a removable storage card) as the one or more memory die 1698. The controller 1650 may include the ECC decoding capability discussed herein. Commands and Data are transferred between the host and controller 1650 via lines 1620 and between the controller and the one or more memory die 1698 via lines 1618.

The control circuitry 1610 cooperates with the read/write circuits 1665 to perform memory operations on the memory array 1500. The control circuitry 1610 includes a state machine 1612, an on-chip address decoder 1614, a boost control 1615 and a power control module 1616. The state machine 1612 provides chip-level control of memory operations. The on-chip address decoder 1614 provides an address interface between that used by the host or a memory controller to the hardware address used by the decoders 1630 and 1660. The boost control 1615 can be used for setting a boost mode, including determining a timing for initiating source side and drain side boosting, as discussed herein. The power control module 1616 controls the power and voltages supplied to the word lines and bit lines during memory operations.

In some implementations, some of the components of FIG. 16 can be combined. In various designs, one or more of the components (alone or in combination), other than storage element array 1500, can be thought of as a managing circuit. For example, one or more managing circuits may include any one of or a combination of control circuitry 1610, state machine 1612, decoders 1614/1660, power control 1616, sense blocks 1600, read/write circuits 1665, controller 1650, etc.

Figure 17:
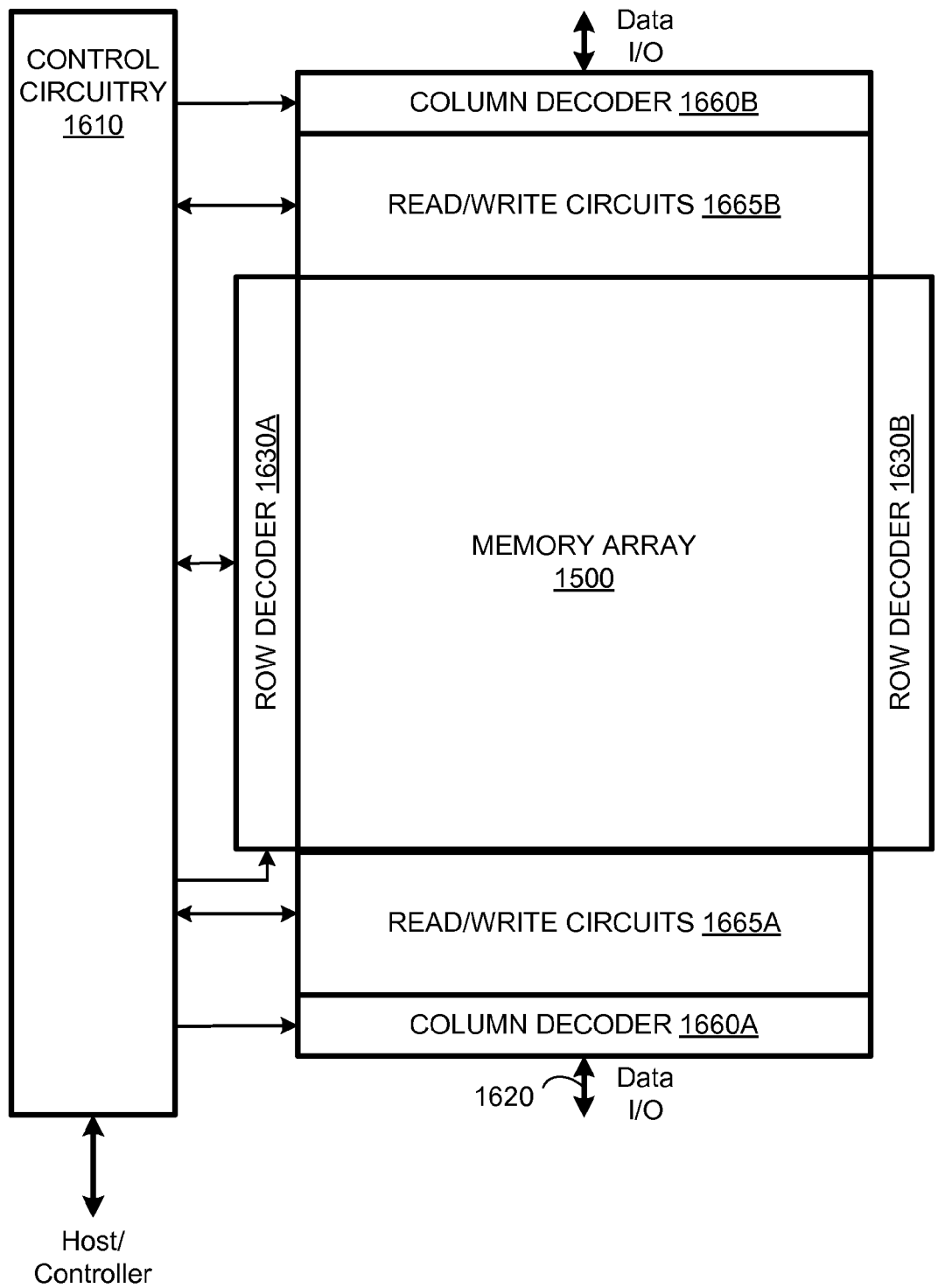
FIG. 17 is a block diagram of a non-volatile memory system using dual row/column decoders and read/write circuits.

FIG. 17 is a block diagram of a non-volatile memory system using dual row/column decoders and read/write circuits. Here, another arrangement of the memory device 1696 shown in FIG. 16 is provided. Access to the memory array 1500 by the various peripheral circuits is implemented in a symmetric fashion, on opposite sides of the array, so that the densities of access lines and circuitry on each side are reduced by half. Thus, the row decoder is split into row decoders 1630A and 1630B and the column decoder into column decoders 1660A and 1660B. Similarly, the read/write circuits are split into read/write circuits 1665A connecting to bit lines from the bottom and read/write circuits 1665B connecting to bit lines from the top of the array 1500. In this way, the density of the read/write modules is essentially reduced by one half. The device of FIG. 17 can also include a controller, as described above for the device of FIG. 16.

Figure 18:
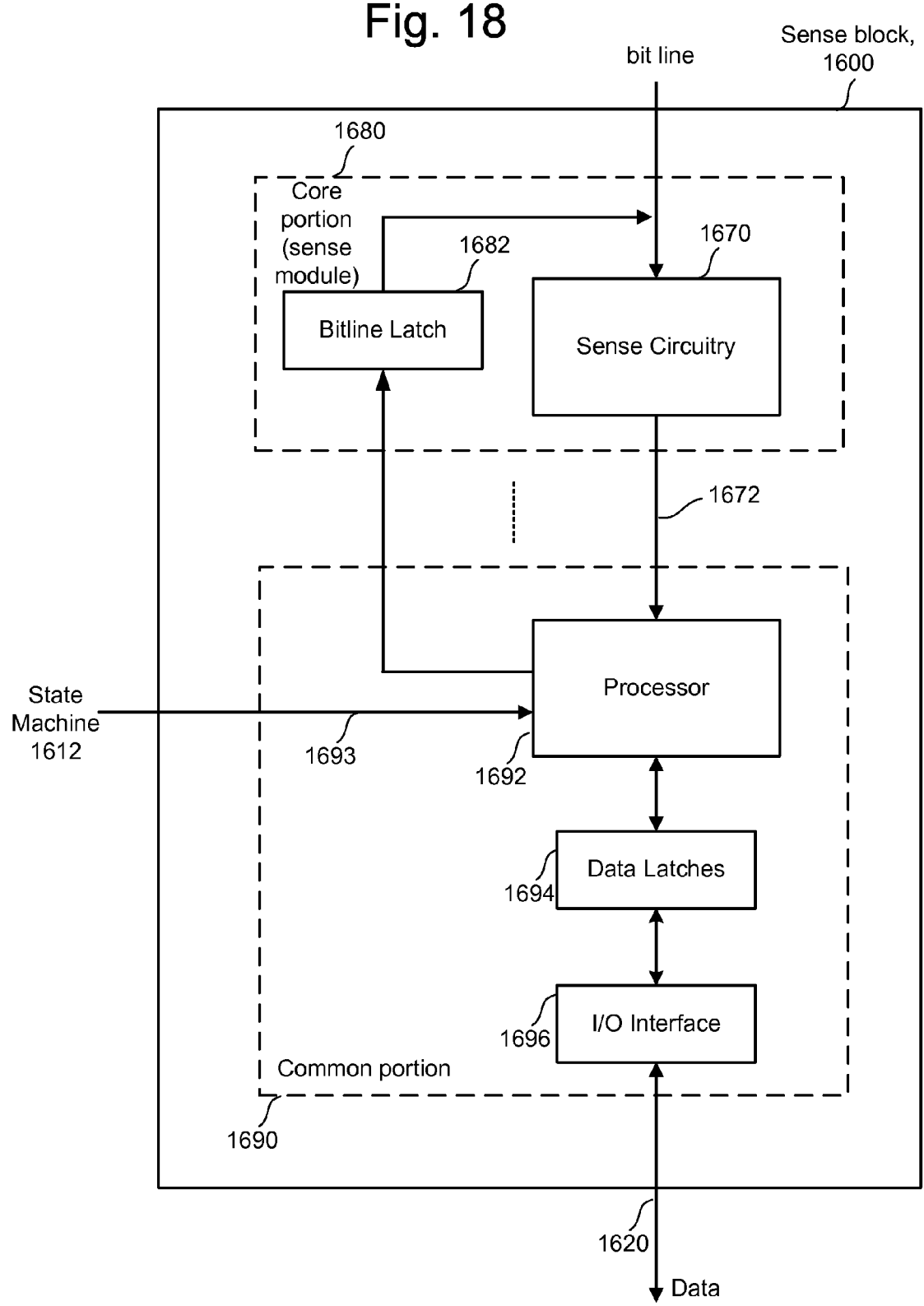
FIG. 18 is a block diagram depicting one embodiment of a sense block.

FIG. 18 is a block diagram depicting one embodiment of a sense block. An individual sense block 1600 is partitioned into a core portion, referred to as a sense module 1680, and a common portion 1690. In one embodiment, there will be a separate sense module 1680 for each bit line and one common portion 1690 for a set of multiple sense modules 1680. In one example, a sense block will include one common portion 1690 and eight sense modules 1680. Each of the sense modules in a group will communicate with the associated common portion via a data bus 1672. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1680 comprises sense circuitry 1670 that determines whether a conduction current in a connected bit line is above or below a predetermined threshold level. Sense module 1680 also includes a bit line latch 1682 that is used to set a voltage condition on the connected bit line. For example, a predetermined state latched in bit line latch 1682 will result in the connected bit line being pulled to a state designating program inhibit (e.g., $V_{dd}$).

Common portion 1690 comprises a processor 1692, a set of data latches 1694 and an I/O Interface 1696 coupled between the set of data latches 1694 and data bus 1620. Processor 1692 performs computations. For example, one of its functions is to determine the data stored in the sensed storage element and store the determined data in the set of data latches. The set of data latches 1694 is used to store data bits determined by processor 1692 during a read operation. It is also used to store data bits imported from the data bus 1620 during a program operation. The imported data bits represent write data meant to be programmed into the memory. I/O interface 1696 provides an interface between data latches 1694 and the data bus 1620.

During read or sensing, the operation of the system is under the control of state machine 1612 that controls the supply of different control gate voltages to the addressed storage element. As it steps through the various predefined control gate voltages corresponding to the various memory states supported by the memory, the sense module 1680 may trip at one of these voltages and an output will be provided from sense module 1680 to processor 1692 via bus 1672. At that point, processor 1692 determines the resultant memory state by consideration of the tripping event(s) of the sense module and the information about the applied control gate voltage from the state machine via input lines 1693. It then computes a binary encoding (code word) for the memory state and stores the resultant data bits into data latches 1694. In another embodiment of the core portion, bit line latch 1682 serves double duty, both as a latch for latching the output of the sense module 1680 and also as a bit line latch as described above.

It is anticipated that some implementations will include multiple processors 1692. In one embodiment, each processor 1692 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1692 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1694 from the data bus 1620. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1692 monitors the read back memory state relative to the desired memory state. When the two are in agreement, the processor 1692 sets the bit line latch 1682 so as to cause the bit line to be pulled to a state designating program inhibit. This inhibits the storage element coupled to the bit line from further programming even if programming pulses appear on its control gate. In other embodiments the processor initially loads the bit line latch 1682 and the sense circuitry sets it to an inhibit value during the verify process.

Data latch stack 1694 contains a stack of data latches corresponding to the sense module. In one embodiment, there are three data latches per sense module 1680. In some implementations (but not required), the data latches are implemented as a shift register so that the parallel data stored therein is converted to serial data for data bus 1620, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. patent application Ser. No. 11/015, 199 titled "Improved Memory Sensing Circuit And Method For Low Voltage Operation," filed on Dec. 16, 2004; (4) U.S. patent application Ser. No. 11/099,133, titled "Compensating for Coupling During Read Operations of Non-Volatile Memory," filed on Apr. 5, 2005; and (5) U.S. patent application Ser. No. 11/321,953, titled "Reference Sense Amplifier For Non-Volatile Memory, filed on Dec. 28, 2005. All five of the immediately above-listed patent documents are incorporated herein by reference in their entirety.

Figure 19:
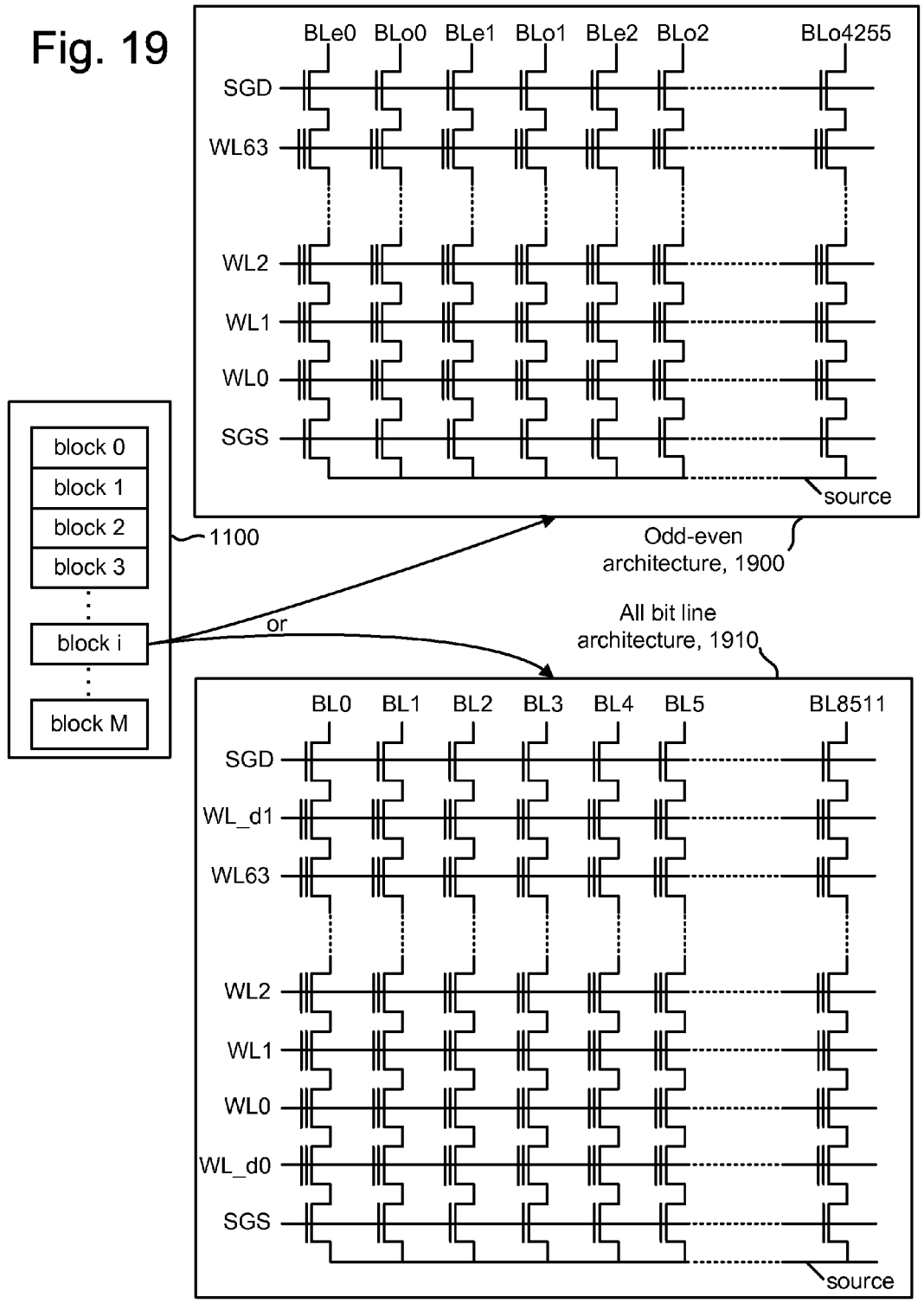
FIG. 19 illustrates an example of an organization of a memory array into blocks for an all bit line memory architecture or for an odd-even memory architecture.

FIG. 19 illustrates an example of an organization of a memory array into blocks for an all bit line memory architecture or for an odd-even memory architecture. Exemplary structures of memory array 1500 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1910), all the bit lines of a block can be simultaneously selected during read and program operations. Storage elements along a common word line and connected to any bit line can be programmed at the same time.

In the example provided, 64 storage elements and two dummy storage elements are connected in series to form a NAND string. There are sixty four data word lines and two dummy word lines, WL-d0 and WL-d1, where each NAND string includes sixty four data storage elements and two dummy storage elements. In other embodiments, the NAND strings can have more or less than 64 data storage elements and two dummy storage elements. Data memory cells can store user or system data. Dummy memory cells are typically not used to store user or system data.

One terminal of the NAND string is connected to a corresponding bit line via a drain select gate (connected to select gate drain lines SGD), and another terminal is connected to c-source via a source select gate (connected to select gate source line SGS).

In one embodiment, referred to as an odd-even architecture (architecture 1900), the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 20:
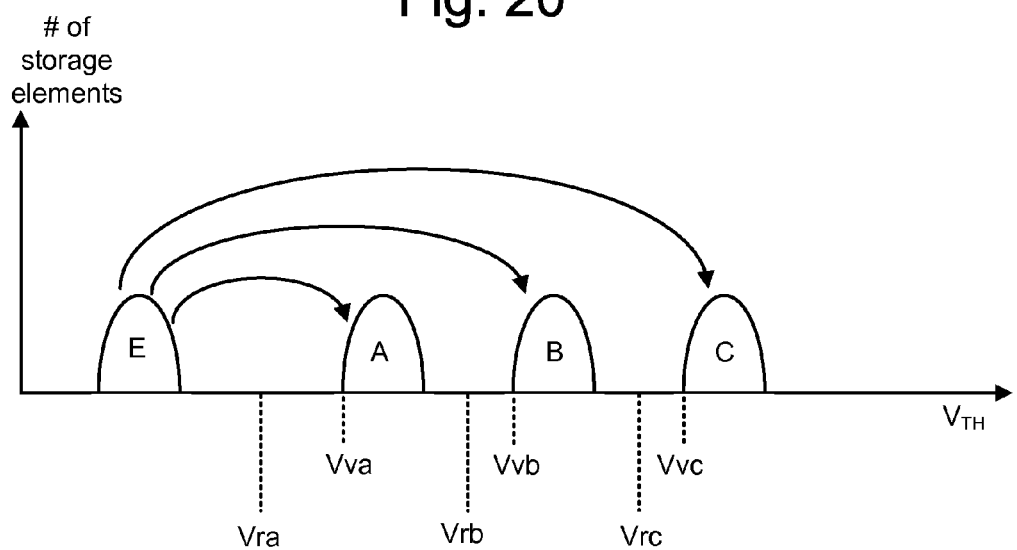
FIG. 20 depicts an example set of threshold voltage distributions.

FIG. 20 depicts an example set of threshold voltage distributions. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive. Note that this simplified example refers to four states. However, additional states, e.g., 16, 32, 64 or more can be used.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in. With four states, three read reference voltages or compare points are used. With sixteen states, fifteen compare points are used, and so on. These are compare points of the type referred to at steps 1102, 1110, 1132, 1150, 1172, 1192, 1478 and 1486, discussed previously.

Further, three verify reference voltages, Vva, Vvb and Vvc, are provided. Additional verify points can be used for storage elements which store data indicative of additional programming states. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 24 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent storage element on WLn. The process shown can be extended to additional states as well.

Figure 21:
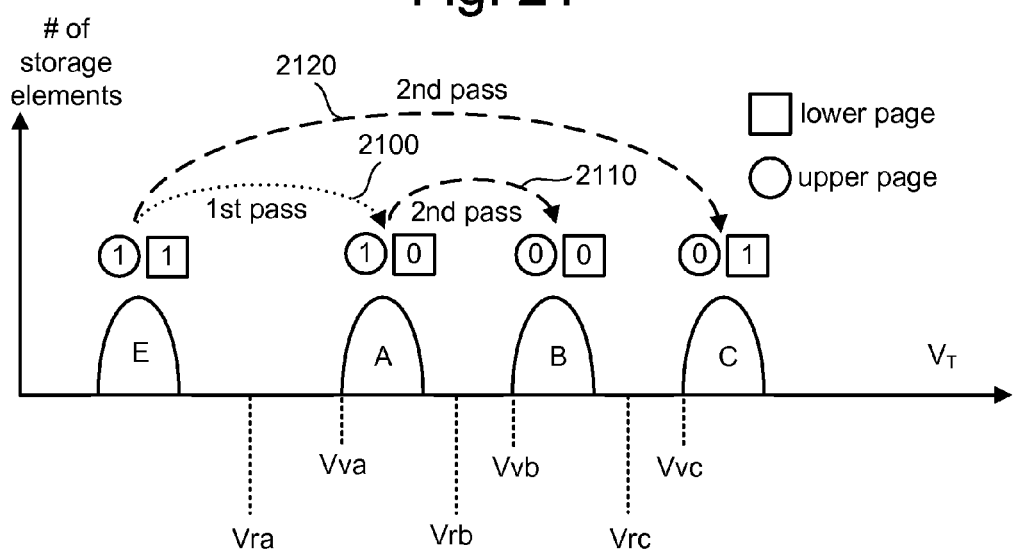
FIG. 21 depicts an example set of threshold voltage distributions.

FIG. 21 illustrates an example of a two-pass technique of programming a multi-state storage element that stores data for two different pages: a lower page and an upper page. Four states are depicted: state E (11), state A (10), state B (00) and state C (01). The process shown can be extended to additional states as well. For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 2100. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 2120. If the storage element had been programmed into state A as a result of the first programming pass, then the storage element is further programmed in the second pass so that the threshold voltage is increased to be within state B, as depicted by arrow 2110. The result of the second pass is to program the storage element into the state designated to store a logic "0" for the upper page without changing the data for the lower page. In both FIG. 20 and FIG. 21, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

FIGS. 22*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. The process shown can be extended to additional states as well. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 22*a* therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1)

in the NAND string will then be programmed with respect to its lower page. For example, referring to FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 2250 of FIG. 22b. This apparent widening of the threshold voltage distribution will be remedied when programming the upper page.

FIG. 22c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 2250 and the upper page data is to remain at 1, then the storage element will be programmed to final state B. If the storage element is in intermediate threshold voltage distribution 2250 and the upper page data is to become data 0, then the threshold voltage of the storage element will be raised so that the storage element is in state C. The process depicted by FIGS. 22a-c reduces the effect of floating gate to floating gate coupling because only the upper page programming of neighbor storage elements will have an effect on the apparent threshold voltage of a given storage element. An example of an alternate state coding is to move from distribution 2250 to state C when the upper page data is a 1, and to move to state B when the upper page data is a 0.

Although FIGS. 22a-c provide an example with respect to four data states and two pages of data, the concepts taught can be applied to other implementations with more or fewer than four states and different than two pages.

Figure 23:
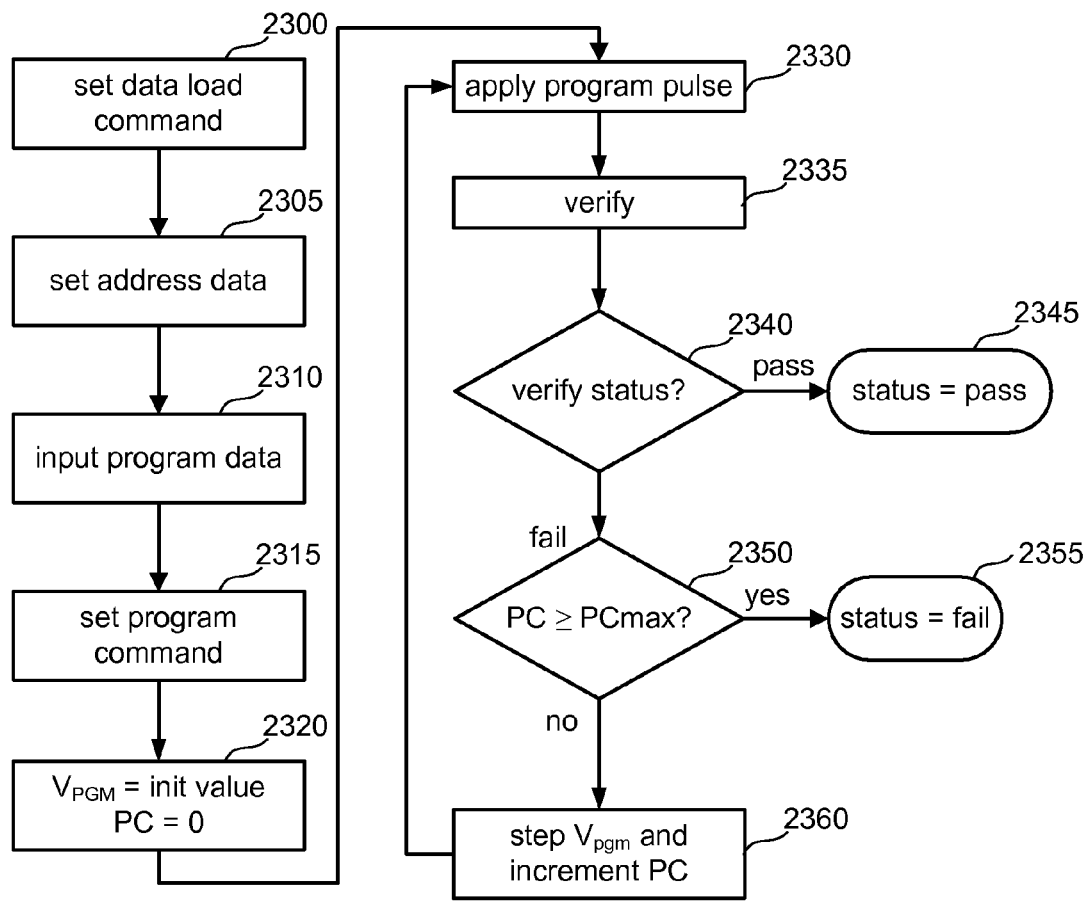
FIG. 23 is a flow chart describing one embodiment of a process for programming non-volatile memory.

FIG. 23 is a flow chart describing one embodiment of a method for programming non-volatile memory. In one implementation, storage elements are erased (in blocks or other units) prior to programming. In step 2300, a "data load" command is issued by the controller and input received by control circuitry 1610. In step 2305, address data designating the page address is input to decoder 1614 from the controller or host. In step 2310, a page of program data for the addressed page is input to a data buffer for programming. That data is latched in the appropriate set of latches. In step 2315, a "program" command is issued by the controller to state machine 1612.

Triggered by the "program" command, the data latched in step 2310 will be programmed into the selected storage elements controlled by state machine 1612 using the stepped program pulses of the pulse train 2400 of FIG. 24 applied to the appropriate selected word line. In step 2320, the program voltage, $V_{PGM}$, is initialized to the starting pulse (e.g., 12 V or other value) and a program counter (PC) maintained by state machine 1612 is initialized at zero. In step 2330, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to $V_{dd}$ to inhibit programming.

In step 2335, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In decision step 2340, a check is made as to whether all of the data latches are storing logic "1." If all of the data latches are storing logic "1," the programming process is complete and successful because all selected storage elements were programmed and verified. A status of "PASS" is reported in step 2345.

If, in step 2340, it is determined that not all of the data latches are storing logic "1," then the programming process continues. In decision step 2350, the program counter PC is checked against a program limit value PCmax. One example of a program limit value is twenty; however, other numbers can also be used. If the program counter PC is not less than PCmax, then the program process has failed and a status of "FAIL" is reported in step 2355. If the program counter PC is less than PCmax, then $V_{PGM}$ is increased by the step size and the program counter PC is incremented in step 2360. The process then loops back to step 2330 to apply the next $V_{PGM}$ pulse.

FIG. 24 depicts an example pulse train 2400 applied to the control gates of non-volatile storage elements during programming. The pulse train 2400 includes a series of program pulses 2405, 2410, 2415, 2420, 2425, 2430, 2435, 2440, 2445, 2450, . . . , that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 2406 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 21) or Vvb' (FIG. 22a), for instance.

As mentioned, the voltages which are applied to word lines to implement a boost mode are applied when programming occurs, e.g., prior to and during a program pulse. In practice, the boost voltages of a boost mode can be initiated slightly before each program pulse and removed after each program pulse. On the other hand, during the verify process, for instance, which occurs between program pulses, the boost voltages are not applied. Instead, read voltages, which are typically less than the boost voltages, are applied to the unselected word lines. The read voltages have an amplitude which is sufficient to maintain the previously programmed storage elements in a NAND string on when the threshold voltage of a currently-programmed storage element is being compared to a verify level.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   retrieving stored data from a set of non-volatile storage elements which is in communication with a selected word line in a memory array by:
      applying at least a first pre-conditioning waveform to at least one non-volatile storage element in the set of non-volatile storage elements in association with a first read operation;
      performing the first read operation on the set of non-volatile storage elements;
      performing a second read operation on the set of non-volatile storage elements; and
      determining programmed states of non-volatile storage elements in the set of non-volatile storage elements responsive to the first and second read operations.

2. The method of claim 1, wherein:
   the performing the first read operation comprises applying a series of read reference voltages to the selected word line, the read reference voltages are different than verify voltages; and
   the at least a first pre-conditioning waveform is applied a specified time before at least one of the read reference voltages in the series.

3. The method of claim 1, wherein:
   the performing the first read operation comprises applying a series of read reference voltages to the selected word line, the read reference voltages are different than verify voltages; and
   at least one pre-conditioning waveform is applied a specified time before each read reference voltage in the series.

4. The method of claim 1, wherein:
   the at least a first pre-conditioning waveform is applied to at least one of a control gate, source and drain of the at least one non-volatile storage element.

5. The method of claim 1, wherein:
   the at least a first pre-conditioning waveform is applied to the at least one non-volatile storage element via a p-well of a substrate on which the set of non-volatile storage elements is formed.

6. The method of claim 1, wherein:
   the at least a first pre-conditioning waveform precedes the first read operation; and
   the second read operation is performed without a preceding associated pre-conditioning waveform.

7. The method of claim 1, wherein:
   the first and second read operations each determine whether voltage thresholds of the non-volatile storage elements in the set of non-volatile storage elements are above or below each of a plurality of different voltage threshold levels.

8. The method of claim 1, wherein:
   the determining the programmed states comprises providing code words based on the first read operation and performing an iterative probabilistic decoding process for decoding the code words, the iterative probabilistic decoding process is responsive to the second read operation.

9. The method of claim 8, further comprising:
   providing initial reliability metrics comprising logarithmic likelihood ratios for use in the iterative probabilistic decoding process based on programming states determined by the first read operation; and
   adjusting the iterative probabilistic decoding process subsequently based on programming states determined by the second read operation.

10. The method of claim 8, further comprising:
    providing initial reliability metrics comprising logarithmic likelihood ratios for use in the iterative probabilistic decoding process based on programming states determined by the first read operation and based on programming states determined by the second read operation.

11. A method for operating non-volatile storage, comprising:
    performing a plurality of sense operations on a set of non-volatile storage elements for each of a plurality of programming states, at least one pre-conditioning waveform is provided for at least one of the sense operations;
    providing a set of reliability metrics comprising logarithmic likelihood ratios based on the sense operations; and
    storing the set of reliability metrics for use by an iterative probabilistic decoding process in determining a programming state of at least one non-volatile storage element in the set of non-volatile storage elements in at least one subsequent sense operation.

12. The method of claim 11, wherein:
    the at least one of the sense operations is preceded by the at least one pre-conditioning waveform; and
    at least one other of the sense operations is not preceded by an associated pre-conditioning waveform.

13. The method of claim 11, wherein:
    at least one other of the sense operations is preceded by at least one associated pre-conditioning waveform; and
    the at least one pre-conditioning waveform provided for the at least one sense operation is applied to the at least one non-volatile storage element via a p-well of a substrate on which the at least one non-volatile storage element is formed, and the at least one pre-conditioning waveform associated with the at least one other of the sense operations is applied to at least one of a control gate, a source and a drain of the at least one non-volatile storage element.

14. The method of claim 11, wherein:
    at least one other of the sense operations is preceded by at least one associated pre-conditioning waveform; and
    the at least one pre-conditioning waveform provided for the at least one sense operation is applied to one terminal of the at least one non-volatile storage element, and the at least one pre-conditioning waveform associated with the at least one other of the sense operations is applied to another terminal of the at least one non-volatile storage element in the set of non-volatile storage elements.

15. A method for operating non-volatile storage, comprising:
    applying at least a first pre-conditioning waveform to at least one non-volatile storage element in association with a first read operation for retrieving stored data from the at least one non-volatile storage element, the at least a first pre-conditioning waveform has an effect on the at least one non-volatile storage element which replicates, at least in part, an effect that a program pulse has on the at least one non-volatile storage element prior to a verify operation, where the effect on the at least one non-volatile storage element comprises an increase in noisy behavior of the at least one non-volatile storage element;
    performing the first read operation on the at least one non-volatile storage element; and determining a programming state of the at least one non-volatile storage element responsive to the first read operation using iterative probabilistic decoding.

16. The method of claim 15, wherein:
the determining the programming state comprises providing a code word based on the first read operation and performing the iterative probabilistic decoding to decode the code word.

17. A non-volatile storage system, comprising:
a set of non-volatile storage elements in communication with a selected word line in a memory array; and
one or more control circuits in communication with the set of non-volatile storage elements, the one or more control circuits, to retrieve stored data from the set of non-volatile storage elements: apply at least a first pre-conditioning waveform to at least one non-volatile storage element in the set of non-volatile storage elements in association with a first read operation, perform the first read operation on the at least one non-volatile storage element, perform a second read operation on the at least one non-volatile storage element, and determine programmed states of non-volatile storage elements in the set of non-volatile storage elements responsive to the first and second read operations.

18. The non-volatile storage system of claim 17, wherein:
the one or more control circuits perform the first read operation by applying a series of read reference voltages to the selected word line, the read reference voltages are different than verify voltages; and
the at least a first pre-conditioning waveform is applied a specified time before at least one of the read reference voltages in the series.

19. The non-volatile storage system of claim 17, wherein:
the one or more control circuits perform the first read operation by applying a series of read reference voltages to the selected word line, the read reference voltages are different than verify voltages; and
at least one pre-conditioning waveform is applied a specified time before each read reference voltage in the series.

20. The non-volatile storage system of claim 17, wherein:
the at least a first pre-conditioning waveform is applied to at least one of a control gate, source and drain of the at least one non-volatile storage element.

21. The non-volatile storage system of claim 17, wherein:
the at least a first pre-conditioning waveform is applied to the at least one non-volatile storage element via a p-well of a substrate on which the set of non-volatile storage elements is formed.

22. The non-volatile storage system of claim 17, wherein:
the at least a first pre-conditioning waveform precedes the first read operation; and
the second read operation is performed without a preceding associated pre-conditioning waveform.

23. The non-volatile storage system of claim 17, wherein:
the first and second read operations each determine whether voltage thresholds of the non-volatile storage elements in the set of non-volatile storage elements are above or below each of a plurality of different voltage threshold levels.

24. The non-volatile storage system of claim 17, wherein:
the one or more control circuits determine the programming states by providing code words based on the first read operation and performing an iterative probabilistic decoding process for decoding the code words, the iterative probabilistic decoding process is responsive to the second read operation.

25. The non-volatile storage system of claim 24, wherein:
the one or more control circuits provide initial reliability metrics comprising logarithmic likelihood ratios for use in the iterative probabilistic decoding process based on programming states determined by the first read operation, and adjust the iterative probabilistic decoding process subsequently based on programming states determined by the second read operation.

26. The non-volatile storage system of claim 24, wherein:
the one or more control circuits provide initial reliability metrics comprising logarithmic likelihood ratios for use in the iterative probabilistic decoding process based on programming states determined by the first read operation and based on programming states determined by the second read operation.

27. The non-volatile storage system of claim 17, wherein:
the at least a first pre-conditioning waveform is applied to the at least one non-volatile storage element via a p-well of a substrate on which the set of non-volatile storage elements is formed.

28. A non-volatile storage system, comprising:
a set of non-volatile storage elements; and
one or more control circuits in communication with the set of non-volatile storage elements, the one or more control circuits perform a plurality of sense operations on the set of non-volatile storage elements for each of a plurality of programming states, at least one pre-conditioning waveform is provided for at least one of the sense operations, provide a set of reliability metrics comprising logarithmic likelihood ratios based on the sense operations, and store the set of reliability metrics for use by an iterative probabilistic decoding process in determining a programming state of at least one non-volatile storage element in the set of non-volatile storage elements in at least one subsequent sense operation.

29. The non-volatile storage system of claim 28, wherein:
the at least one of the sense operations is preceded by the at least one pre-conditioning waveform; and
at least one other of the sense operations is not preceded by an associated pre-conditioning waveform.

30. The non-volatile storage system of claim 28, wherein:
at least one other of the sense operations is preceded by at least one associated pre-conditioning waveform; and
the at least one pre-conditioning waveform provided for the at least one sense operation is applied to the at least one non-volatile storage element via a p-well of a substrate on which the at least one non-volatile storage element is formed, and the at least one pre-conditioning waveform associated with the at least one other of the sense operations is applied to at least one of a control gate, a source and a drain of the at least one non-volatile storage element.

31. The non-volatile storage system of claim 28, wherein:
each of the sense operations comprises a read operation which reads back a programmed state which has been programmed into at least one non-volatile storage element in the set of non-volatile storage elements, and the read operation makes a determination as to whether a voltage threshold of the at least one non-volatile storage element is above or below each of a plurality of different voltage threshold levels.

32. The non-volatile storage system of claim 28, wherein:
at least one other of the sense operations is preceded by at least one associated pre-conditioning waveform; and
the at least one pre-conditioning waveform provided for the at least one sense operation is applied to one terminal of the at least one non-volatile storage element, and the at least one pre-conditioning waveform associated with the at least one other of the sense operations is applied to another terminal of the at least one non-volatile storage element.

33. The non-volatile storage system of claim 28, wherein:

the one or more control circuits obtain voltage threshold profiles of the at least one non-volatile storage element for each of the plurality of programming states, the set of reliability metrics is based on the voltage threshold profiles.

34. The non-volatile storage system of claim 28, wherein:

at least one other of the sense operations is preceded by at least one associated pre-conditioning waveform which differs from the at least one pre-conditioning waveform provided for the at least one sense operation in at least one characteristic.

35. A non-volatile storage system, comprising:

a set of non-volatile storage elements; and one or more control circuits in communication with the set of non-volatile storage elements, the one or more control circuits: (a) apply at least a first pre-conditioning waveform to at least one non-volatile storage element in the set of non-volatile storage elements in association with a first read operation to retrieve stored data from the at least one non-volatile storage element, the at least a first pre-conditioning waveform has an effect on the at least one non-volatile storage element which replicates, at least in part, an effect that a program pulse has on the at least one non-volatile storage element prior to a verify operation, (b) perform the first read operation on the at least one non-volatile storage element, and (c) determine a programming state of the at least one non-volatile storage element responsive to the first read operation using iterative probabilistic decoding, where the one or more control circuits access initial reliability metrics comprising logarithmic likelihood ratios for use in the iterative probabilistic decoding, the initial reliability metrics are developed by applying pre-conditioning waveforms in association with read operations to the set of non-volatile storage elements.

36. The non-volatile storage system of claim 35, wherein:

the one or more control circuits determine the programming state by providing a code word based on the first read operation and performing the iterative probabilistic decoding to decode the code word.

37. A non-volatile storage system, comprising:

a set of non-volatile storage elements; and one or more control circuits in communication with the set of non-volatile storage elements, the one or more control circuits: (a) apply at least a first pre-conditioning waveform to at least one non-volatile storage element in the set of non-volatile storage elements in association with a first read operation to retrieve stored data from the at least one non-volatile storage element, the at least a first pre-conditioning waveform has an effect on the at least one non-volatile storage element which replicates, at least in part, an effect that a program pulse has on the at least one non-volatile storage element prior to a verify operation, the effect on the at least one non-volatile storage element comprises an increase in noisy behavior of the at least one non-volatile storage element, (b) perform the first read operation on the at least one non-volatile storage element, and (c) determine a programming state of the at least one non-volatile storage element responsive to the first read operation using iterative probabilistic decoding.

* * * * *